US010818749B2

(12) United States Patent
Mauder et al.

(10) Patent No.: US 10,818,749 B2
(45) Date of Patent: Oct. 27, 2020

(54) SEMICONDUCTOR DEVICES AND A CIRCUIT FOR CONTROLLING A FIELD EFFECT TRANSISTOR OF A SEMICONDUCTOR DEVICE

(71) Applicant: Infineon Technologies AG, Neubiberg (DE)

(72) Inventors: Anton Mauder, Kolbermoor (DE); Wolfgang Bergner, Klagenfurt (AT); Jens Peter Konrath, Villach (AT); Dethard Peters, Hoechstadt (DE); Reinhold Schoerner, Grossenseebach (DE)

(73) Assignee: Infineon Technologies AG, Neubiberg (DE)

( * ) Notice: Subject to any disclaimer, the term of this patent is extended or adjusted under 35 U.S.C. 154(b) by 76 days.

(21) Appl. No.: 15/374,012

(22) Filed: Dec. 9, 2016

(65) Prior Publication Data

US 2017/0170264 A1 Jun. 15, 2017

(30) Foreign Application Priority Data

Dec. 10, 2015 (DE) ........................ 10 2015 121 566

(51) Int. Cl.

| | |
|---|---|
| ***H01L 29/06*** | (2006.01) |
| ***H01L 29/78*** | (2006.01) |
| ***H01L 27/07*** | (2006.01) |
| ***H01L 21/82*** | (2006.01) |
| ***H01L 29/739*** | (2006.01) |

(Continued)

(52) U.S. Cl.

CPC ...... *H01L 29/0634* (2013.01); *H01L 21/8213* (2013.01); *H01L 27/0605* (2013.01);

(Continued)

(58) Field of Classification Search

CPC ............... H01L 27/0664; H01L 29/872; H01L 27/0766; H01L 29/7806; H01L 29/7805; H01L 29/7803

See application file for complete search history.

(56) References Cited

U.S. PATENT DOCUMENTS 6,240,010 B1 5/2001 Mukai et al.
7,576,388 B1 * 8/2009 Wilson ................ H01L 29/0847 257/330

(Continued)

FOREIGN PATENT DOCUMENTS

DE 102012216648 A1 3/2013
DE 112004002608 B4 12/2015

(Continued)

*Primary Examiner* — Phat X Cao
*Assistant Examiner* — Diana C Vieira
(74) *Attorney, Agent, or Firm* — Murphy, Bilak & Homiller, PLLC

(57) ABSTRACT

A semiconductor device includes a plurality of drift regions of a plurality of field effect transistor structures arranged in a semiconductor substrate. The plurality of drift regions has a first conductivity type. The semiconductor device further includes a plurality of compensation regions arranged in the semiconductor substrate. The plurality of compensation regions has a second conductivity type. Each drift region of the plurality of drift regions is arranged adjacent to at least one compensation region of the plurality of compensation regions. The semiconductor device further includes a Schottky diode structure or metal-insulation-semiconductor gated diode structure arranged at the semiconductor substrate.

11 Claims, 17 Drawing Sheets

(51) Int. Cl.

| | |
|---|---|
| ***H01L 29/808*** | (2006.01) |
| ***H01L 29/872*** | (2006.01) |
| ***H01L 29/16*** | (2006.01) |
| ***H01L 27/06*** | (2006.01) |
| *H01L 29/861* | (2006.01) |
| *H01L 29/40* | (2006.01) |
| *H01L 29/10* | (2006.01) |

(52) U.S. Cl.

CPC ...... *H01L 27/0629* (2013.01); *H01L 27/0664* (2013.01); *H01L 27/0727* (2013.01); *H01L 29/7397* (2013.01); *H01L 29/7803* (2013.01); *H01L 29/7804* (2013.01); *H01L 29/7806* (2013.01); *H01L 29/7813* (2013.01); *H01L 29/7827* (2013.01); *H01L 29/8083* (2013.01); *H01L 29/872* (2013.01); *H01L 29/8725* (2013.01); *H01L 29/0619* (2013.01); *H01L 29/1095* (2013.01); *H01L 29/1608* (2013.01); *H01L 29/407* (2013.01); *H01L 29/7395* (2013.01); *H01L 29/8613* (2013.01)

(56) References Cited

U.S. PATENT DOCUMENTS

| | | | | |
|---|---|---|---|---|
| 7,638,841 | B2 * | 12/2009 | Challa | H01L 21/3065 257/341 |
| 7,755,138 | B2 * | 7/2010 | Saito | H01L 29/0634 257/330 |
| 8,643,085 | B2 * | 2/2014 | Pfirsch | H01L 29/0653 257/328 |
| 8,786,011 | B2 * | 7/2014 | Yamagami | H01L 21/8213 257/328 |
| 8,829,608 | B2 * | 9/2014 | Saito | H01L 29/0865 257/331 |
| 9,324,807 | B1 * | 4/2016 | Bhalla | H01L 29/7803 |
| 9,627,525 | B2 * | 4/2017 | Hiyoshi | H01L 29/47 |
| 2007/0114602 | A1 * | 5/2007 | Saito | H01L 29/0619 257/330 |
| 2008/0135929 | A1 * | 6/2008 | Saito | H01L 29/0634 257/330 |
| 2009/0108303 | A1 | 4/2009 | Pfirsch | |
| 2010/0264488 | A1 * | 10/2010 | Hsieh | H01L 29/7813 257/334 |
| 2013/0001592 | A1 * | 1/2013 | Miyahara | H01L 29/4236 257/77 |
| 2015/0069411 | A1 | 3/2015 | Esteve et al. | |
| 2019/0273157 | A1 * | 9/2019 | Yilmaz | H01L 29/407 |

FOREIGN PATENT DOCUMENTS

| | | | |
|---|---|---|---|
| JP | 2000216407 | A | 8/2000 |
| JP | 2001196602 | A | 7/2001 |
| JP | 2007013087 | A | 1/2007 |
| JP | 2008117826 | A | 5/2008 |

* cited by examiner

SEMICONDUCTOR DEVICES AND A CIRCUIT FOR CONTROLLING A FIELD EFFECT TRANSISTOR OF A SEMICONDUCTOR DEVICE

TECHNICAL FIELD

Embodiments relate to concepts for semiconductor device structures and in particular to semiconductor devices.

BACKGROUND

Metal oxide semiconductor field effect transistors (MOSFETs) (e.g. double-diffused MOSFETS) are short circuited between the source and body regions. Between the source region and drain region of a MOSFET structure, a p-n diode structure is present at a junction or interface between the body region and the drift region of the MOSFET structure. The p-n diode is switched in anti-parallel to the MOS channel of the MOSFET structure, for example. With wide bandgap components, (e.g. silicon carbide based components), the p-n diode has (due to the wide bandgap of the semiconductor) a high forward threshold voltage or forward voltage (in the reverse operation) which is substantially higher than the voltage drop over the MOS component in forward operation, which may thermally limit the current carrying capacity of the arrangement, for example.

SUMMARY

It is a demand to provide concepts for semiconductor devices with reduced on-state losses in the reverse operation and/or reduced switching losses.

Some embodiments relate to a semiconductor device. The semiconductor device comprises a plurality of drift regions of a plurality of field effect transistor structures arranged in a semiconductor substrate. The plurality of drift regions comprises a first conductivity type. The semiconductor device further comprises a plurality of compensation regions arranged in the semiconductor substrate. The plurality of compensation regions comprises a second conductivity type. Each drift region of the plurality of drift regions is arranged adjacently to at least one compensation region of the plurality of compensation regions. The semiconductor device further comprises at least one Schottky diode structure or metal-insulation-semiconductor gated diode structure arranged at the semiconductor substrate.

Some embodiments relate to a further semiconductor device. The semiconductor device comprises a field effect transistor structure arranged at a semiconductor substrate. The semiconductor device further comprises a trench structure extending from a surface of the semiconductor substrate into the semiconductor substrate. The trench structure comprises a Schottky contact interface of a Schottky diode structure or a gate of a metal-insulation-semiconductor gated diode structure within the trench structure. The semiconductor device further comprises a shielding doping region extending from a portion of at least one sidewall of the trench structure towards a channel region of the field effect transistor structure.

Some embodiments relate to a further semiconductor device. The semiconductor device comprises a plurality of junction field effect transistor structures of a junction field effect transistor arrangement arranged at a semiconductor substrate. The semiconductor device further comprises at least one metal-insulation-semiconductor gated diode structure.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
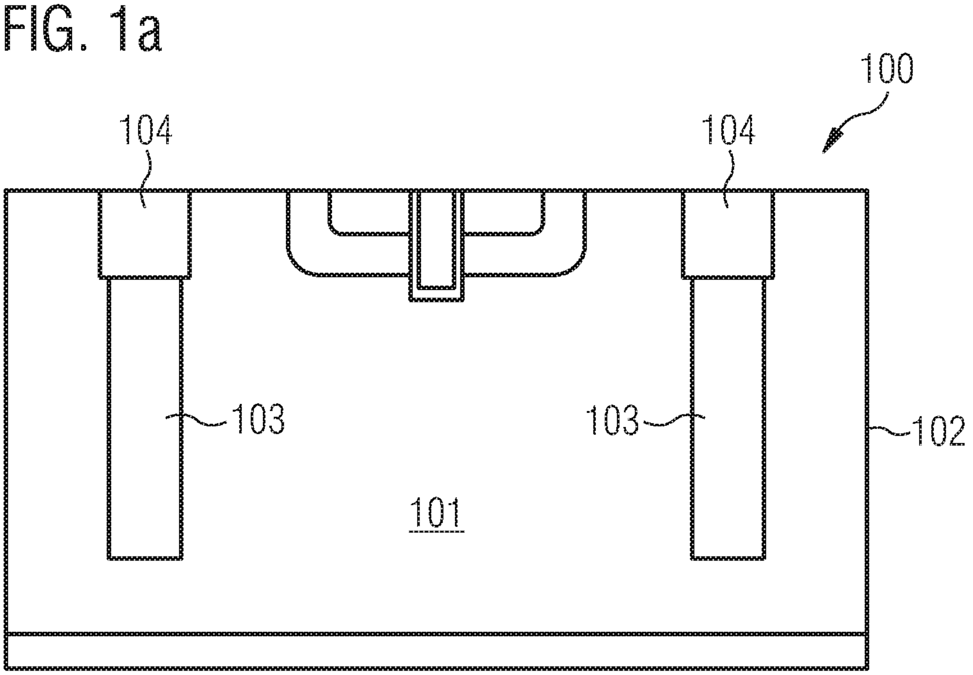
FIG. 1A shows a schematic illustration of a semiconductor device.

FIG. 1A shows a schematic illustration of a semiconductor device 100 according to an embodiment.

The semiconductor device 100 comprises a plurality of drift regions 101 of a plurality of field effect transistor structures arranged in a semiconductor substrate 102. The plurality of drift regions 101 comprise a first conductivity type The semiconductor device 100 further comprises a plurality of compensation regions 103 arranged in the semiconductor substrate 102. The plurality of compensation regions 103 comprises a second conductivity type.

Each drift region 101 of the plurality of drift regions 101 is arranged adjacently to at least one compensation region 103 of the plurality of compensation regions 103.

The semiconductor device 100 further comprises at least one Schottky diode structure or metal-insulation-semiconductor gated diode structure 104 arranged at the semiconductor substrate 102.

Due to the semiconductor device 100 comprising at least one Schottky diode (SD) structure or metal-insulation-semiconductor gated diode (MGD) structure 104 arranged at the semiconductor substrate 102, the SD structure or MGD structure may provide a unipolar current path having a smaller forward voltage than a bipolar/p-n body diode between drift region and a body region. This may lead to forward (or conduction) losses in the body diode operation being reduced. The plurality of compensation regions 103 arranged in the semiconductor substrate may inject charge carriers during a high increase in forward voltage in the body diode operation, which may lead to improved electrical conductivity in the drift zone. Overall, switching and/or on-state losses of the semiconductor device 100 may be reduced and/or switching speeds of the semiconductor device 100 may be increased.

A SD structure may include a Schottky contact forming a Schottky contact interface (e.g. a Schottky junction) with portion of the semiconductor substrate 102, for example. The Schottky contact may be formed in a trench structure extending from a surface of the semiconductor substrate 102 into the semiconductor substrate 102. For example, the trench structure in which at least part of the SD structure or the MGD structure 104 is formed may extend from the first lateral side or surface (e.g. the front surface) of the semiconductor substrate 102 vertically into the semiconductor substrate 102. Alternatively or optionally, the Schottky contact may be formed at or on the surface of the semiconductor substrate 102. For example, the Schottky contact may be a lateral electrode or contact (which does not extend vertically into the semiconductor substrate 102.

A material of the Schottky contact may be chosen such that a Schottky barrier is formed between the Schottky contact and the semiconductor substrate 102. The Schottky interface may be located between the Schottky contact and a drift region of the Schottky diode structure in the semiconductor substrate 102. The drift region of the SD structure may be part of a common drift zone of the semiconductor substrate 102. The common drift zone may include the plurality of drift regions 101 of the plurality of field effect transistor structures (and/or drift regions of other SD structures and/or drift regions of other MGD structures) connected to each other to form the connected (or common) drift zone.

The Schottky contact may include (or may be formed from) a material having a lower work function than an electron affinity of the semiconductor substrate 102 if the semiconductor substrate 102 is an n-type doped semiconductor substrate. For example, if the semiconductor substrate 102 is an n-type doped silicon carbide based substrate, the material of the Schottky contact of the Schottky diode structure may be aluminum, aluminum-copper, copper, tungsten, tungsten nitride, titanium, titanium nitride, molybdenum, molybdenum nitride, boron nitride, carbon nitride for example. Silicon carbide may be used to provide devices with high breakdown or blocking voltage. Very high electric fields may occur in a silicon carbide substrate during operation of a silicon carbide device. The Schottky contact of the Schottky diode structure may be arranged in an area of the silicon carbide substrate exposed to significantly lower electric fields than a maximal electric field occurring during operation of the silicon carbide device (e.g. lower than 70%, 50% or 30% of the maximal electric field). For example, the Schottky contact forming a Schottky contact interface may be arranged above (closer to a front side surface of the silicon carbide substrate) an adjacent compensation regions 103 (e.g. FIG. 1*b* or 1*c*). In this way, a high leakage current over the Schottky diode structure may be avoided in a blocking state of the silicon carbide device.

An MGD structure 104 may include a gate electrode material and a gate insulation layer arranged in a (vertical) trench structure. The MGD structure may be formed in the trench structure extending from the (first lateral) surface of the semiconductor substrate 102 into the semiconductor substrate 102. The gate insulation (e.g. silicon oxide) layer may be arranged on sidewalls (e.g. on a first vertical sidewall and second vertical sidewall) and at a bottom of the trench structure, for example. The electrically conductive gate electrode material (e.g. polysilicon) may be arranged in (or may at least partially fill the trench structure, such that the gate insulation layer is located between the gate electrode material and the semiconductor substrate 102, for example. The gate insulation layer of the MGD structure 104 may have a maximum thickness which lies between 10 nm and 150 nm (or e.g. between 20 nm and 100 nm, or e.g. between 30 nm and 60 nm), for example. The maximum thickness may be a largest thickness of the gate insulation layer between a sidewall (or bottom) of the trench and the gate electrode material, for example. The gate insulation layer of the MGD structure 104 may have a different thickness between a sidewall of the trench and the gate electrode material and between the bottom of the trench and the gate electrode material. For example, a thickness of the gate insulation of the MGD structure 104 may be larger at the bottom of the trench than at the sidewalls of the trenches.

For an MGD diode structure, at least part of a (first) sidewall of the trench structure may be arranged adjacently to a drift region (n-type doped) of the MGD diode structure and/or a body region (p-type doped) of the MGD diode structure 104. For example, the drift region of the MGD diode structure 104 and/or the body region of the MGD diode structure may be arranged adjacently to a (first) sidewall of the trench structure. The drift region of the MGD structure may be part of (or connected to) the common drift zone of the semiconductor substrate 102.

A maximum lateral dimension of the trench structure may lie between 0.5 μm and 6 μm (or e.g. between 1 μm and 3 μm), for example. The maximum lateral dimension of the trench structure may be the largest distance between a first (substantially) vertical sidewall and a second (opposite) sidewall of the trench structure in a direction horizontal or parallel to the first lateral surface of the semiconductor substrate 102. A maximum vertical dimension of the trench structure may lie between 200 nm and 6 μm (or e.g. between 500 nm and 2 μm), for example. The maximum vertical dimension of the trench structure may be the largest distance between a first lateral surface of the semiconductor substrate and a bottom of the trench structure in a direction orthogonal or perpendicular to the first lateral surface of the semiconductor substrate 102.

The Schottky diode (SD) structure or the metal-insulation-semiconductor gated diode (MGD) structure 104 may be formed at least partially in the semiconductor substrate 102. For example, at least part of the SD structure or at least part of the MGD structure may be formed in the semiconductor substrate 102.

Each diode structure 104 (e.g. which may be the SD structure or the MGD structure) may be arranged between the (first lateral) surface of the semiconductor substrate 102 and a compensation region 103 of the plurality of compensations regions 103, for example. Optionally, the SD structure or MGD structure 104 may be arranged adjacently (e.g. directly adjacently) to a compensation region 103. Alternatively or optionally, other doping regions or layers may be arranged between the SD structure or MGD structure 104 and the compensation region 103, for example. Optionally, at least part of the SD structure or MGD structure 104 may be arranged at the (first lateral) surface of the semiconductor substrate 102.

The diode structure 104 may have smaller forward threshold voltage than a SiC p-n diode, for example. For example, a forward threshold voltage of the Schottky diode structure or the metal-insulation-semiconductor gated diode structure may lie between 0.2V and 1V compared to a forward voltage of between 1.5V and 6V or more than 2.8V for a SiC p-n diode.

The plurality of compensation regions 103 may be regions of the semiconductor substrate 102 comprising a stripe-shape, a circular-shape, a hexagonal shape or a polygonal shape in a top view of the semiconductor device 100. A stripe-shape may be a geometry extending in a second lateral direction significantly farther than in an orthogonal first lateral direction. For example, a compensation region 103 may comprise a lateral length of more than 10× (or more than 100× or more than 1000×) a lateral width of a compensation region 103 of the plurality of compensation regions. The lateral length of the compensation regions 103 may be the largest extension along the front surface of the semiconductor substrate and a lateral width (e.g. between 1 μm and 5 μm or between 2 μm and 3 μm) of the compensation region may be a shortest dimension of the compensation regions 103 along the front surface of the semiconductor substrate. The compensation regions of the plurality of compensation regions may all comprise the same lateral length and/or the same lateral width. Alternatively, the lateral length and/or the lateral width of the compensation regions of the plurality of compensation regions 103 may differ at least partly from each other. Neighboring compensation regions 103 of the plurality of compensation regions 103 may be separated in at least one lateral direction (e.g. the first lateral direction) by a lateral distance of less than 20 μm (or less than 10 μm or less than 5 μm, or e.g. about 4 μm), for example.

Furthermore, the compensation regions 103 of the plurality of compensation regions 103 comprise a vertical extension (e.g. vertical depth). In other words, the compensation regions 103 may be (laminar) plane structures or may (each) comprise the geometry of a pillar, a wall, a plate, a hexagonal prism, or the geometry of ellipsoids, stacks of (intersected) ellipsoids or cuboids, for example. The vertical extension may be larger than the lateral width and shorter than the lateral length, for example. For example, the compensation regions 103 of the plurality of compensation regions 103 may extend from a front surface of the semiconductor substrate 102 into a depth of more than 5 μm (or more than 10 μm or more than 20 μm more than 50 μm). For example, a compensation region 103 of the plurality of compensation regions 103 may extend from a body region 104 of a FET structure or from the trench (in which at least part of the diode structure is formed) vertically into the semiconductor substrate 102 towards the back surface of the semiconductor substrate 102. In the case of a silicon carbide semiconductor substrate, the critical electric field may be an order of magnitude higher than that of a silicon semiconductor substrate which may allow the blocking voltage region to be thinner than a silicon semiconductor substrate at the same blocking voltage. For example, a drift zone thickness of 20 μm in a silicon carbide semiconductor substrate may be sufficient to support a blocking voltage of 2000V, for example.

The compensation regions 103 of the plurality of compensation regions 103 may extend laterally in one direction through a vertical FET arrangement of a plurality of FET structures, for example. Optionally, the compensation regions 103 of the plurality of compensation regions 103 may extend in the one direction into an edge termination region. Alternatively, the compensation regions 103 of the plurality of compensation regions 103 may be significantly smaller than a lateral extension of the FET structures of the vertical FET arrangement (e.g. several compensation structures may be arranged in a line and several lines of compensation structures may be arranged in parallel to each other). For example, at least a part of the compensation regions 103 of the plurality of compensation regions may be arranged substantially in parallel to each other (e.g. neglecting manufacturing tolerances).

In a cross-section orthogonal to the lateral length of the plurality of compensation regions 103, the compensation regions 103 may comprise a pillar shape, a column shape a wall shape, a plate shape, a hexagonal prism shape, an ellipsoid shape, or a cuboid shape, for example. The plurality of compensation regions 103 may be arranged alternating to the plurality of drift regions 101 of the vertical FET arrangement (in a cross section orthogonal to a lateral length of the compensation regions). For example, the plurality of compensation regions 103 may be arranged alternating to the plurality of drift regions 101 in a (first) lateral direction. For example, a drift region 101 of the vertical FET structures may extend into the semiconductor substrate 102 between two compensation regions 103 within the semiconductor device 100.

The compensation regions 103 may have a doping of a second conductivity type. For example, a doping type of the compensations region may be opposite to the doping type of the drift regions 101, for example. The compensation region 103 may have an average doping concentration of at least $1\times10^{17}$ dopant atoms per $cm^3$ (or e.g. between $1\times10^{17}$ dopant atoms per $cm^3$ and $1\times10^{19}$ dopant atoms per $cm^3$), for example. The average doping concentration may be a measured number of dopant atoms (e.g. acceptor dopant atoms) per volume averaged over the compensation region 103, for example.

The plurality of drift regions 101 of the plurality of FET structures may be part of a common drift zone of the vertical FET arrangement. For example, the plurality of drift regions 101 of the plurality of FET structures may part of a common drift zone located in the semiconductor substrate 102, for example. For example, the plurality of drift regions 101 may be connected or joined to each other to form a commonly doped drift zone having the same doping concentration and the same conductivity type. The drift regions 101 may be connected to each other below the compensation regions 103 by a common or shared part of the drift zone. Optionally, the drift regions 101 may be connected to drift regions of the SD structures 104 and/or drift regions of the MGD structures 104 between the channel regions of the plurality of FET structures and the drain or collector regions (e.g. between the compensation regions 103 or below the compensation regions 103), for example.

The plurality of drift regions 101 of the plurality of FET structures may extend from body regions or channel regions of the plurality of (vertical) FETs between the compensation regions 103 vertically into the semiconductor substrate 102. For example, each drift region 101 of the plurality of drift regions 101 may be arranged between neighboring compensation regions 103 in the semiconductor substrate, and may extend from a body region or channel region vertically into the semiconductor substrate 102.

The drift regions 101 of the plurality of FET structures may carry the majority or the complete current flowing between the front side and the back side of the semiconductor substrate 102 in an on-state of the plurality of FET structures, for example. For example, each drift region 101 of an FET structure may carry charge carriers (or current) between a channel of the FET structure to an electrode located at the back surface of the semiconductor substrate 102. The drift regions 101 may be low doped regions arranged on (or in) a highly (or higher) doped semiconductor substrate 102, for example. Optionally, a field stop region having the first conductivity type (e.g. n doped) and a higher doping concentration than the drift region 101 may be located between the drift region and the back surface or substrate of the FET structure.

The plurality of drift regions 101 of the plurality of FET structures may have a doping of the first conductivity type. The drift region 101 may have an average doping concentration of at least $1\times10^{17}$ dopant atoms per $cm^3$ (or e.g. between $1\times10^{17}$ dopant atoms per $cm^3$ and $1\times10^{19}$ dopant atoms per $cm^3$). The average doping concentration may be a measured number of dopant atoms (e.g. acceptor dopant atoms) per volume averaged over the drift region 101, for example.

Each drift region 101 of the plurality of drift regions 101 is arranged adjacently to at least one compensation region 103 of the plurality of compensation regions 103. Additionally or optionally, each drift region 101 may be arranged between neighboring compensation regions 103, for example. Additionally or optionally, the drift regions 101 in the semiconductor substrate 102 may be separated from each other by the compensation regions 103 down to the depth of the compensation regions 103.

The semiconductor device 100 may be a compensation device, for example. Compensation devices may be based on mutual compensation of at least a part of the charge of n- and p-type doped areas in the drift region of the vertical field effect transistor (FET) arrangement. For example, in a vertical FET arrangement, alternating p- and n-pillars or plates (e.g. a plurality of drift regions 101 and a plurality of compensation regions 103 in an alternating arrangement in a lateral direction) may be arranged in pairs. A compensation region 103 of the plurality of compensation regions 103 may comprise a laterally summed number of dopants per unit area of the second conductivity type (p or n) deviating from half of a laterally summed number of dopants per unit area of the first conductivity type (n or p) comprised by two drift regions 101 located adjacent to opposite sides of the compensation region by less than +/−25% (or less than +/−15%, or less than +/−10%, or less than +/−5%, or less than +/−2%, or less than +/−1%) of the laterally summed number of dopants per unit area of the first conductivity type comprised by the compensation region 103. The lateral summed number of dopants per unit area may be substantially constant or may vary for different depths. The lateral summed number of dopants per unit area may be equal or proportional to a number of free charge carriers within a compensation region 103 or a drift region 101 to be compensated in a particular depth, for example. Optionally or alternatively, a planar cross-section parallel to the semiconductor substrate lateral surface and intersecting the drift regions 101 and the compensation regions 103 may be defined, and the doping in the sectional plane may added with the correct sign. The result may be analogous, in that the addition with the correct sign may be less than +/−25% (etc.) of the addition of the individual doping species (n or p).

Each FET structure of the plurality of FET structures may be a metal oxide semiconductor field effect transistor (MOSFET) structure, an insulated gate bipolar transistor (IGBT) structure, or a junction field effect transistor (JFET) structure, for example. For example, the examples may relate to SiC semiconductor circuits (e.g. SiC MOS transistors. SiC compensation transistors, SiC MOSFETs, SiC compensation MOSFETs, SiC JFETs und SiC compensations-JFETs).

Each MOSFET structure or IGBT structure may include a source or emitter region having a first conductivity type (e.g. n+ doped), a body region having a second conductivity type (e.g. p-type doped) and a drift region (e.g. n-type doped) located adjacently to a transistor gate or transistor gate trench structure.

In the case of the FET structure being a MOSFET structure, the drift region 101 of the MOSFET structure may be located between a body region of the MOSFET structure and a drain region of the MOSFET structure located at a second lateral side (e.g. a back surface) of the semiconductor substrate 102. The drain region of the MOSFET structure may have the first conductivity type (e.g. n+ doped), for example.

In the case of the FET structure being an IGBT structure, the drift region 101 of the IGBT structure may be located between a body region of the IGBT structure and a collector region of the IGBT structure located at the second lateral side (e.g. a back surface) of the semiconductor substrate 102. The collector region of the IGBT structure may have the second conductivity type (e.g. p+ doped). Optionally, a field stop region having the first conductivity type (e.g. n+ doped) and higher doped than the drift region 101 may be located between the drift region and the collector region of the IGBT structure.

When a first gate voltage is applied to the transistor gate of a MOSFET or IGBT FET structure, the FET structure may be switched to an on-state. When the MOSFET or IGBT FET structure is in an on-state, a conductive channel (e.g. an n-channel) may be formed (or induced) in the body region between the source region and the drift region of the MOSFET or IGBT FET structure. The conductive channel may be formed in a part of the body region adjacent to the transistor gate, e.g. by forming an inversion channel, and a current flow may occur between the source region of the FET structure and the drift region.

When a second gate voltage is applied the transistor gate of the MOSFET or IGBT FET structure the FET structure may be switched to an off-state. When the MOSFET or IGBT FET structure is in an off-state, a depletion region may be formed partly in the drift region 101 of the MOSFET or IGBT FET structure and current flow between the source region of the FET structure and the drift region may be reduced or terminated, for example.

In the case of the FET structure being a JFET structure, a drift region 101 of the JFET structure may be located between the channel region of the JFET structure and a drain region of the JFET structure located at the second lateral side (e.g. a back surface) of the semiconductor substrate 102. The drain region of the JFET structure may have a first conductivity type (e.g. n+ doped), for example. The channel region of the JEFT structure may be located between the drift region 101 of the JEFT structure and the source region of the JFET structure located at the first lateral side of the semiconductor substrate 102. The channel region of the JFET structure and the drift region 101 of the JFET structure may have the same (e.g. the first) conductivity type (e.g. n-type doped) and/or doping concentration, for example. A transistor gate of the JFET structure may be used to control an electric conductivity or a resistance of the channel region and thus current conducted through the channel region from the source region of the JFET structure towards the drain region of the JFET structure. For example, at least one p-n junction may be formed between a side of the channel region (n-type doped) and a gate doping region (e.g. p-type doped) arranged adjacently to the channel region. The transistor gate may control the p-n junction between the gate doping region and the channel region, and hence may control the electric conductivity or the resistance of the channel region by controlling the size of a depletion region created by the p-n junction. For example, the conducting channel region in the n-type doped region (or e.g. the n-channel) may be depleted of mobile carriers or pinched off by the p-n junction.

If a first gate voltage is applied to the transistor gate of a JFET structure, the FET structure may be switched to (or may be in) an on-state (e.g. forward biased). When the JFET structure is in an on-state, a conductive channel (e.g. an n-channel) may be formed (or may exist) between the source region and the drift region of the JFET structure. A current flow may occur between the source region of the JFET structure and the drift region of the JFET structure, for example.

If a second gate voltage is applied to the transistor gate of the JFET structure, the FET structure may be switched to an off-state. When the JFET structure is in an off-state, the depletion region of the p-n junction may be increase, and may extend into the channel region of the JFET structure, thus reducing or constricting the electric conductivity or increasing the resistance of the channel region of the JEFT structure. Due to the channel region being depleted of charge carriers, current flow between the source region of the JFET structure and the drift region of the JFET structure may be reduced or terminated, for example.

The source or emitter region of the FET structure (e.g. of the MOSFET, IGBT or JFET structure) may have an average doping concentration of more than $1\times10^{18}$ dopant atoms per $cm^3$ (or e.g. between $1\times10^{18}$ dopant atoms per $cm^3$ and $1\times10^{20}$ dopant atoms per $cm^3$). The average doping concentration may be a measured number of dopant atoms per volume averaged over the source or emitter region of the FET structure 102, for example.

The drain or collector region of the FET structure (e.g. the MOSFET, IGBT or JFET structure) may have an average doping concentration of more than $1\times10^{17}$ dopant atoms per $cm^3$ (or e.g. between $1\times10^{17}$ dopant atoms per $cm^3$ and $1\times10^{20}$ dopant atoms per $cm^3$). The average doping concentration may be a measured number of dopant atoms per volume averaged over the drain or collector region of the FET structure 102, for example.

The body region of the MOSFET or IGBT structure may have an average doping concentration of between $5\times10^{16}$ dopant atoms per $cm^3$ and $1\times10^{19}$ dopant atoms per $cm^3$ (or e.g. between $2\times10^{17}$ dopant atoms per $cm^3$ and $1\times10^{18}$ dopant atoms per $cm^3$). The average doping concentration may be a measured number of dopant atoms per volume averaged over the body region of the FET structure 102, for example.

A region comprising the first conductivity type may be a p-type doped region (e.g. caused by incorporating aluminum ions or boron ions) or an n-type doped region (e.g. caused by incorporating nitrogen ions, phosphor ions or arsenic ions). Consequently, the second conductivity type indicates an opposite n-type doped region or p-type doped region. In other words, the first conductivity type may indicate an n-type doping and the second conductivity type may indicate a p-type doping or vice-versa.

The semiconductor device 100 may include a source or emitter contact structure electrically connected to the source or emitter regions of the plurality of FET structures. In order to create a source to body region short circuit connection, the source or emitter contact structure may further be electrically connected to body regions of the plurality of FET structures. The semiconductor device 100 may further include a drain or collector contact structure electrically connected to the drain or collector regions of the plurality of FET structures. The semiconductor device 100 may further include a transistor gate contact structure electrically connected to the transistor gates of the FET structures. Each of the source or emitter contact structure, the drain or collector contact structure and the transistor gate contact structure may include or may be formed from one or more metallization layers which may be formed at surfaces of the semiconductor substrate 102. Each of the source or emitter contact structure, the drain or collector contact structure and the transistor gate contact structure may be electrically insulated from each other outside the semiconductor substrate, for example.

The plurality of FET structures may be electrically connected in parallel to the at least one SD structure or the MGD structure 104, for example. For example, a FET structure of the plurality of FET structures may be connected in parallel (e.g. in anti-parallel) to the diode structure 104. The diode structure 104 may be (either) the Schottky diode structure or the metal-insulation-semiconductor gated diode structure 104 described herein.

The diode structure 104 may be connected in anti-parallel to the FET structure, such that the diode structure 104 may be reversed biased (switched to an off-state) when the FET structure is forward biased (e.g. switched to an on-state or switched to an off-state) and vice versa. In this way, the diode structure 104 may be a freewheeling diode, which may provide a path for charge carriers from the drain region or the drift region of the FET structure when the FET structure is reversed biased. For an n− channel transistor under forward bias operation (e.g. when a positive voltage is applied at the drain of the transistor), the freewheeling diode may be in blocking polarity (e.g. since a positive voltage is applied at the cathode and a negative voltage is applied at the anode of the freewheeling diode). For the n-channel transistor under reverse bias operation (or body diode operation), when a more negative voltage is applied to the drain than at the source, the freewheeling diode may take over (or conduct) the current, independently from whether the transistor is in a conducting on-state or in a blocking off-state. It may be understood that inverse voltage polarities (compared to the voltage polarities applied to the n-channel transistor) may be provided to the drain and source of a p-channel transistor to achieve forward bias operation of the transistor or reverse bias operation of the transistor.

The source or emitter contact structure may further be electrically connected to the Schottky contact interface (or e.g. to the Schottky contact) of the SD structure in the case of the diode structure 104 being an SD structure, or to the gate electrode of the MGD structure, in the case of the diode structure 104 being an MGD structure. The source or emitter contact structure may further be electrically connected to a body region of the MGD structure, for example. The source or emitter contact structure may further be electrically connected to the plurality of compensation regions. Optionally, the source or emitter contact structure may be electrically connected to the plurality of compensation regions 103 via (or through) the SD structure or MGD structure 104 located between the source or emitter contact structure and the plurality of compensation regions 103, for example.

The drain or collector contact structure may be electrically connected to the drift regions of the SD structure or MGD structures 104 and/or the drift regions of the FET structures. For example, the drain or collector contact structure may be electrically connected to the common drift zone.

Each semiconductor device 100 may be a power semiconductor device having a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The semiconductor substrate 102 may be a silicon-based semiconductor substrate (e.g. a silicon substrate). For example, semiconductor substrate 102 may be wide band gap semiconductor substrate having a band gap larger than the band gap of silicon (1.1 eV). For example, the semiconductor substrate 102 may be a binary or ternary III-V semiconductor substrate or a binary or temary II-VI semiconductor substrate or diamond or a silicon carbide (SiC)-based semiconductor substrate, or gallium arsenide (GaAs)-based semiconductor substrate, or a gallium nitride (GaN)-based semiconductor substrate.

The first lateral surface or front surface of the semiconductor substrate 102 may be a surface of the semiconductor substrate 102 towards metal layers, insulation layers and/or passivation layers on top of the surface of the substrate or a surface of one of these layers. These layers may each cover a part or a portion of the surface of the semiconductor substrate 102, for example. For example, a semiconductor substrate 102 front side may be the side at which active elements of the chip are formed. For example, in a power semiconductor chip, a chip front side may be a side of the chip at which a source region and a gate region are formed, and a chip back side may be a side of the chip at which a drain region is formed. For example, more complex structures may be located at the chip front side than at the chip back side. It may be understood that other configurations may also be possible. For example, in a source-down configuration a source region and gate region may be located at the back side of the chip and the drain region may be located at the front side of the chip.

A lateral surface of the semiconductor substrate 102 may be a substantially even plane (e.g. neglecting unevenness of the semiconductor structure due to the manufacturing process, or e.g. structured layers and/or structured trenches). For example, the lateral dimension of the lateral surface of the semiconductor substrate 102 may be more than 100 times larger (or more than 1000 times or more than 10000 times) than a maximal height of structures on the main surface. In comparison to a basically vertical edge (e.g. resulting from separating the substrate of the chip from others) of the semiconductor substrate 102, the lateral surface may be a basically horizontal surface extending laterally. The lateral dimension of the lateral surface of the semiconductor substrate 102 may be more than 2 times larger (or more than 10 times or more than 100× times) than a basically vertical edge of the semiconductor substrate 102, for example.

A first lateral direction may be a direction substantially parallel to a lateral surface of the semiconductor substrate, for example. A second lateral direction may be a direction substantially parallel to the lateral surface of the semiconductor substrate, and orthogonal (or perpendicular) to the first lateral direction, for example. A vertical direction may be a direction substantially orthogonal (or perpendicular) to the lateral surface of the semiconductor substrate, for example.

Figure 2A:
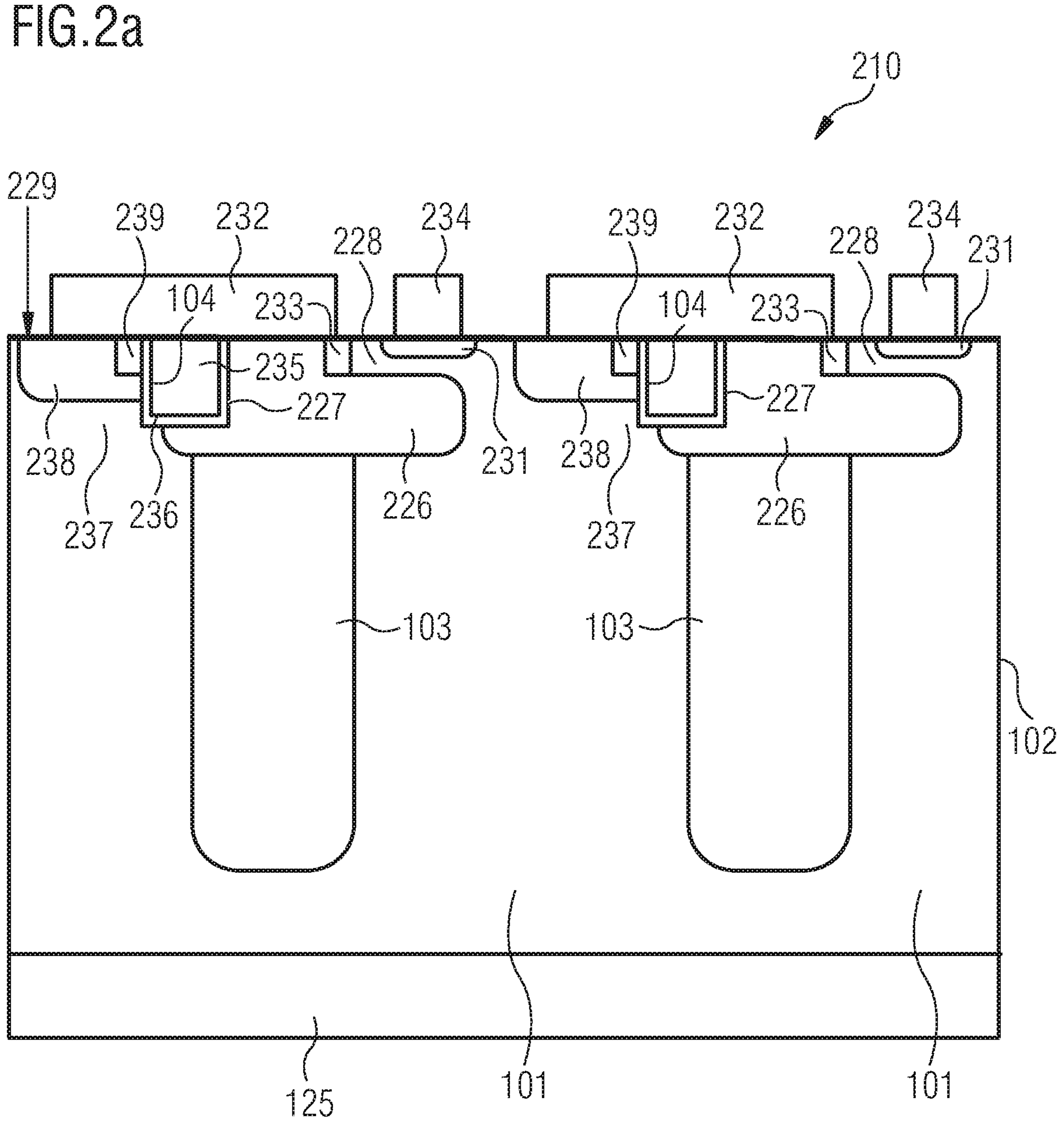
FIG. 2A shows a schematic illustration of a semiconductor device having a plurality of junction field effect transistor structures.

The semiconductor device may further include at least one (e.g. one or more) shielding doping regions (as shown in FIG. 2A, for example). The at least one shielding doping region may comprise (or have) the second conductivity type (e.g. p-type doped). A doping concentration of the at least one shielding doping region may be higher than a doping concentration of the plurality compensation regions 103, for example. For example, the shielding doping region may have an average doping concentration of greater than $1\times10^{16}$ dopant atoms per $cm^3$ (or e.g. greater than $1\times10^{17}$ dopant atoms per $cm^3$, or e.g. greater than $1\times10^{18}$ dopant atoms per $cm^3$). The average doping concentration may be a measured number of dopant atoms (e.g. acceptor dopant atoms) per volume averaged over the shielding doping region, for example.

Each shielding doping region may be arranged adjacently to the diode structure 104. For example, a shielding doping region may be arranged between the diode structure 104 and a drift region 101 of the FET structure. Alternatively, additionally or optionally, a shielding doping region may be arranged between a compensation region 103 of the plurality of compensations regions and the diode structure 104), for example. Alternatively, additionally or optionally, a shielding doping region may extend from the diode structure 104 towards a channel region of a FET structure of the plurality of FET structures (as shown in FIG. 2A, for example).

The shielding doping region may have a maximum lateral dimension of less than 800 nm (or e.g. less than 500 nm, or e.g. between 10 nm and 400 nm, or e.g. between 50 nm and 100 nm), for example. For example, a maximum lateral dimension of the shielding doping region may be a largest distance measured between a first (substantially) vertical side of the shielding doping region to a second (substantially) vertical side of the shielding doping region in a direction parallel to the first lateral surface of the semiconductor substrate 102, for example. A maximum vertical dimension of the shielding doping region may lie between 200 nm and 4 μm (or e.g. between 500 nm and 3 μm), for example. The maximum vertical dimension of the shielding doping region may be the largest distance between a first lateral surface of the semiconductor substrate and a bottom of the shielding doping region in a direction orthogonal or perpendicular to the first lateral surface of the semiconductor substrate 102, for example.

The shielding doping regions may be electrically connected to the source or emitter contact structure or to the gate contact structure at the first lateral surface of the semiconductor substrate 102, for example.

The p-n junction between the body region and the drift region of a FET structure may have a comparatively high forward threshold voltage (e.g. forward voltage) due to the high band gap of the semiconductor substrate 102 (e.g. in SiC based semiconductor substrate), for example. The threshold voltage may be substantially higher than the voltage drop over the MOS component in forward operation, for example. For a SiC based semiconductor device, the conductivity in the p-type doped region (e.g. the body region) may be poor due to a high activation energy of the dopants for p-type conduction and a low mobility of holes in the SiC substrate. In addition, the bipolar operation of SiC structures face further challenges concerning the stability of the crystal. The diode structure 104 provides a body diode function of a SiC semiconductor circuit (or device) which may have a forward voltage in normal operation which is lower (or smaller) than the forward voltage of the p-n junction (between the body region and the drift region of a FET structure) in the SiC semiconductor substrate.

The discrete diode structure 104 (e.g. a SiC Schottky diode or a MGD diode) with a smaller forward threshold voltage may be implemented antiparallel to the SiC (FET structure) semiconductor circuit through the arrangement of a second chip, the total chip area and/or the costs may increase and the thermal exploitability (e.g. in motor operations of an inverter (cos φ~1) and in generator operations (cos φ~−1)) may be worse in a parallel circuit with the same total semiconductor area, as only a part of the total area may be used for heat dissipation. For example, since the diode structure 104 is implemented monolithically within the same (or common) semiconductor substrate 102 as the FET structure, a second chip (or semiconductor substrate) is not necessary. Thus, manufacturing costs may be kept low. Furthermore, thermal capabilities may be improved (e.g. in motor operations or generator operations). Furthermore, having a parallel circuit with the same total semiconductor area and using only a part of the total area for heat dissipation may be avoided.

The examples described herein may relate to a monolithically integrated (body) diode structure 104 functionality in SiC semiconductor circuits (e.g. SiC MOSFETs, SiC compensation MOSFETs, SiC JFETs, and/or SiC compensation JFETs) with a smaller forward threshold voltage than a SiC p-n diode. The body diode structure 104 may also be integrated with p-regions (shielding doping regions) of SiC JFETs at source potential, with or without additional compensation regions. The integration of MGD and/or SD body diode structures 104 may be possibly with a JFET channel for the forward bias operation of a SiC transistor, for example.

In some examples, the body diode functionality may be spatially separated in the chip from the switching region (e.g. to simplify the structuring). For example, the body diode structure 104 may be arranged in a ring form around the cell or trench region. The distance between both regions may be small enough, that power dissipation in the regions may diffuse under other regions, so that the whole chip area may be thermally used, for example. In connectivity with high thermal conductivity close to the semiconductor body like a Cu layer with appropriate thickness of several μm, the distance between the regions may be comparable with the chip thickness. With higher thermal conductivity, the distance may be larger due to heat spreading effects, for example.

The various examples described herein relate to the operation condition in which an external voltage applied to a power semiconductor has an inverse polarity in comparison to a 'normal' forward bias operation, and by which through a signal of a control circuit, switches the power semiconductor between forward bias and blocking operation. In the reverse operation condition (e.g. reverse bias or "backwards" operation) a body diode which (always) exists structurally in the power semiconductor is polarized in the flow direction, for example.

In the examples described herein, a unipolar current path is suggested, which lies parallel to the p-n body diode, for example. The unipolar current path may have a smaller forward voltage than the p-n diffusions voltage, which may be 2.8V or more with wide bandgap semiconductor (e.g. silicon carbide). Thus, primarily, the forward (or conduction) losses in the body diode operation may be reduced. This unipolar current path may be implemented through the Schottky structure or through the MGD structure described in connection with the examples. The Schottky diode structures or MGD structures do not lead to carrier flooding, and thus removal of charge carriers is not necessary in normal operation.

In normal operation, no current flow takes place over the p-n diode, which is why no injection of charge carriers occurs in the drift zone and floods the drift zone, for example. Due to the lack of flooding charges, switching losses may be reduced in the body diode during an externally induced switching of the flow operation of the body diode (e.g. from external reversal of polarity of the load terminals) back into the blocking operation.

Due to the lack of carrier injection, the electrical conductivity in the drift zone is limited. This means that the device cannot conduct a high current density in the body diode operation (e.g. in an error case). Therefore, deep reaching p-regions (e.g. compensation regions) which are ohmically connected to the source electrode may extend into the drift zone. These compensation regions, during a high increase in forward current flowing through the body diode resulting in a high increase in forward voltage of the body diode, leads to injection of charge carriers, and thus to an improvement of electrical conductivity in the drift zone, and to a higher conductivity of the body diode (e.g. to an overall higher conductivity of the body diode structure including the p-n junction between the compensation regions and the drift regions, and the SD or MGD structure). Through these measures, deficiencies which the unipolar body diode brings may be improved. The compensations regions may also lead to a faster lateral removal of bipolar charge carriers, and thus to a higher reverse current spikes and hard switching behavior (in other operating states).

The shielding structures (e.g. the shielding doping regions) may prevent or reduce an overloading (e.g. through over-voltages) of the Schottky diode or MGD diode. Additionally or optionally, the shielding doping regions may protect the gate regions of the semiconductor device from breakthrough caused by high electric fields in the direction towards the gate region.

Figure 1B:
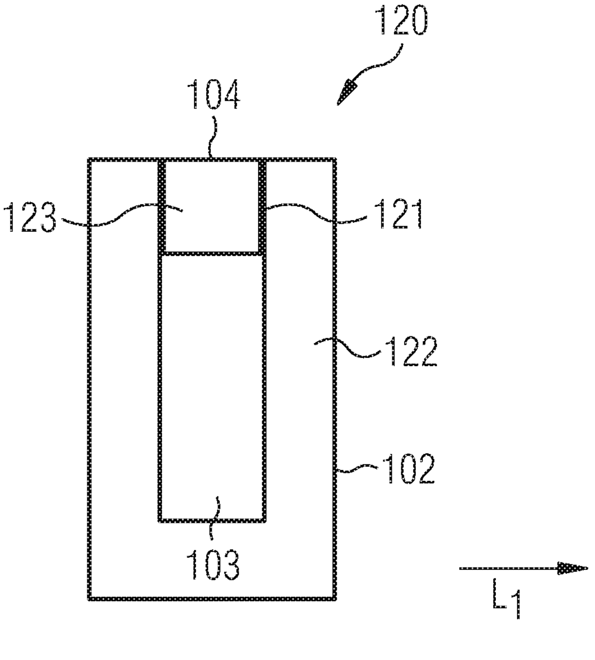
FIG. 1B shows a schematic illustration of a portion of a semiconductor device having a Schottky contact interface.

FIG. 1B shows a schematic illustration of a portion of the semiconductor device 120 according to an embodiment.

The semiconductor device 120 may be similar to the semiconductor device 100 described in connection with FIG. 1A.

The diode structure 104 may be a monolithically integrated Schottky diode structure as shown in FIG. 1B. The SD structure 104 may include a Schottky contact 123 (e.g. a Schottky contact material) arranged directly on a compensation region 103 (e.g. a p-type doped column). For example, a bottom of a trench structure in which the SD contact 123 is formed may be adjacent to a top side of the compensation region 103. At least part of the Schottky contact 123 may form at least one Schottky contact interface 121 with portion of the semiconductor substrate 102, for example. The Schottky interface 121 may be located at the sidewalls of the trench structure in which the SD contact 123 is formed, for example. The Schottky interface 121 may be located at the sidewalls of the trench structure between the Schottky contact 123 and the drift region 122 of the SD structure 104, for example. The drift region 122 of the SD structure 104 may be part of the common drift zone of the semiconductor substrate 102, for example. For example, an area of the sidewall of the trench structure being a Schottky interface is larger (e.g. larger than 1.5 times, 2 times or 3 times) than an area of the bottom of the trench structure being a Schottky interface. For example, no Schottky interface is located at a bottom of the trench structure or less than 50% (or less than 70%) of an area of the bottom of the trench structure is implemented as a Schottky interface. For example, a pn-junction to the drift region or an ohmic contact to a compensation region may be located at the bottom of the trench structure containing the Schottky contact. In this way, high electric fields at the Schottky interface may be avoided, although the bottom of the trench structure may reach into regions of high electric fields. The Schottky interface may be arranged vertically and may be arranged at a position shielded from the electric field by the compensation region.

By implementing the Schottky interface at the sidewalls of the trench structure (vertical arrangement), the lateral demand of space may be decoupled or independent from the current carrying capacity. The current carrying capacity may be increased by larger trench depths without reducing the cell density.

Optionally, the Schottky contact material 123 may be formed only at (or on) the sidewalls of the trench, and not at the bottom of the trench structure. A different (or second) electrically conductive material (or a layer stack of electrically conductive materials) may be formed in the trench structure between the Schottky contact material 123 formed at or on the sidewalls of the trench structure. The second electrically conductive material may form a contact to a top side of the compensation region 103 at the bottom of the trench structure, for example. Optionally, the barrier height at different surfaces of the trench structure may be different. For example, a barrier higher at the sidewalls of the trench structure may be higher than a barrier height at the bottom of the trench structure. For example, the Schottky contact material 123 on the sidewalls of the trench structure may be a layer which has a smaller thickness and an intensifying conductive material.

The Schottky interface 121 provided by the Schottky contact 123 to the drift region 122 of the SD structure 104 (e.g. n-SiC) may lie at a sidewall of the trench structure. The (p-type doped) shielding doping region for blocking the electrical field may be located under (or at) the bottom of the trench structure. The p-type doped shielding doping region may be a flat structure or may be a p-type column of a compensation structure (or compensation region 103), for example. The electric field at the bottom of the trench structure may be reduced due to the p-type doped shielding doping region. Due to the arrangement of the Schottky diode in the upper region of the p-type column, the field strength in the blocking operation mode may be reduced, for example.

Various ways for reducing the leakage current in the Schottky metal of the Schottky contact 123 may include selecting different materials or metals and/or selectively setting the threshold voltage of the Schottky diode structure 104, for example. For example, to reduce the leakage current, a Schottky metal of the Schottky contact with a higher barrier may be selected. Alternatively, additionally or optionally, a shielding p-doping region may be implemented to sink or reduce the electric field at the Schottky barrier.

Due to the deep reaching p-type doped columns 103 (e.g. compensation regions) lying at source potential, the voltage drop in the entire drift zone lies in forward bias over the p-n junction, for example. Thus, the p-n junction may inject at low current densities leading to a better conductivity of the (body) diode structure 104 at high current densities. This may lead to better surge current strength compared to merged pin Schottky structures, which may cause the p-n junction to inject only when the voltage drop over the Schottky contact in connection with the low track voltage drop in the n− region along the p-region is high enough. Depending on the structure, this can happen only if very high currents are reached.

More details and aspects are mentioned in connection with the embodiments described above or below. The embodiments shown in FIG. 1B may comprise one or more optional additional features corresponding to one or more aspects mentioned in connection with the proposed concept or one or more embodiments described above (e.g. FIG. 1A) or below (FIGS. 1C to 10).

Figure 1C:
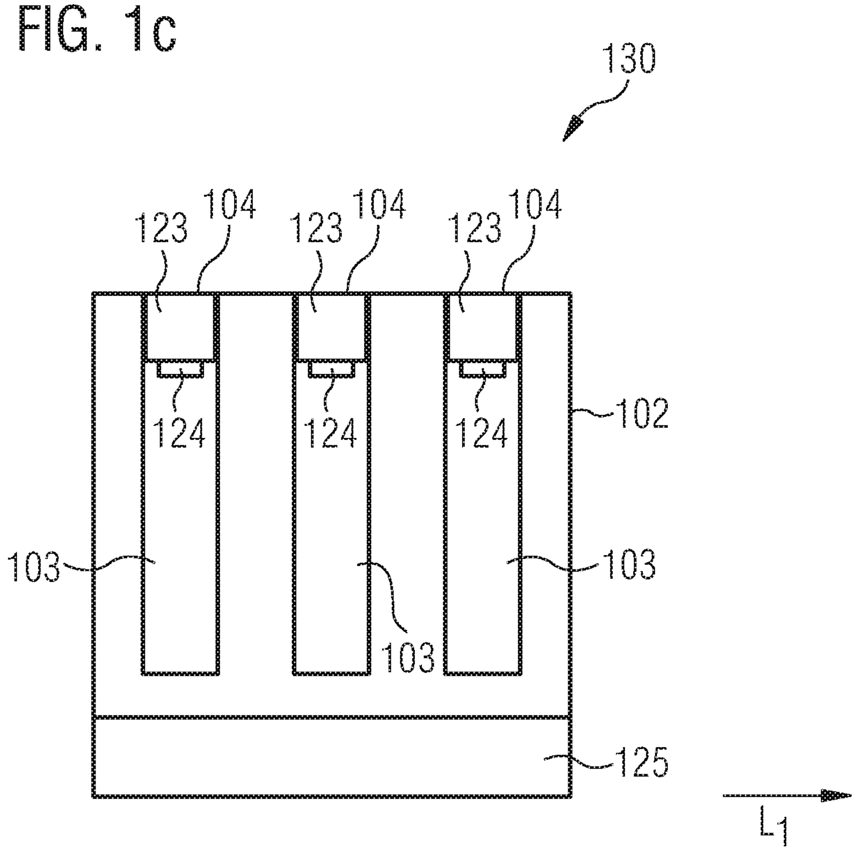
FIG. 1C shows a schematic illustration of a portion of a semiconductor device having a plurality of compensation regions.

FIG. 1C shows a schematic illustration of a portion of a semiconductor device 130 according to an embodiment. As shown in FIG. 1C, the semiconductor device 130 may include a plurality of compensation regions 103 and a plurality of SD structures 104, for example. The semiconductor device 130 may be similar to the semiconductor devices described in connection with FIGS. 1A and/or 1B.

Optionally, the compensation regions 103 of the plurality of compensation regions 103 may include interface regions 124 located at an interface between the compensation regions 103 and the SD contact 123. The interface regions 124 may include (or may be) a highly doped region (p+ doped region), for example. The doping concentration of the highly doped interface regions 124 of the compensation region 103 may be chosen to control or vary a contact resistance between the SD contact 123 and the compensation region 103, for example. The highly doped interface regions 124 may have an average doping concentration of at least $1\times10^{18}$ dopant atoms per $cm^3$ (or e.g. between $1\times10^{18}$ dopant atoms per $cm^3$ and $1\times10^{19}$ dopant atoms per $cm^3$). The average doping concentration may be a measured number of dopant atoms (e.g. acceptor dopant atoms) per volume averaged over the interface region 104, for example. A doping concentration of the highly doped interface region 124 may be higher than a doping concentration of the compensation region 103, for example.

As shown in FIG. 1C, the drain regions 125 of the plurality of FET structures having the first conductivity type (e.g. n+ doped) may be located at a second lateral side (e.g. a back surface) of the semiconductor substrate 102, for example.

The SD contact 123 and the compensation region 103 below the SD contact 123 may be used for semiconductor devices with high blocking voltages of over 2000 V, for example.

More details and aspects are mentioned in connection with the embodiments described above or below. The embodiments shown in FIG. 1C may comprise one or more optional additional features corresponding to one or more aspects mentioned in connection with the proposed concept or one or more embodiments described above (e.g. FIGS. 1A to 1B) or below (FIGS. 2A to 10).

Figure 1D:
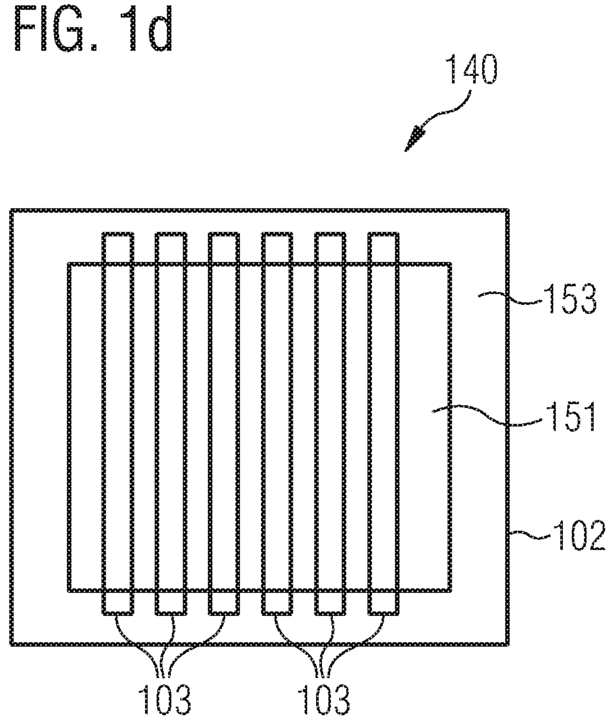
FIG. 1D shows a schematic illustration of a plurality of compensation regions in a top view.

FIG. 1D shows a schematic illustration of a top view of a portion of a semiconductor device 140 according to an embodiment. As shown in FIG. 1D, the semiconductor device 140 may include a plurality of compensation regions 103.

The plurality of FET structures and the diode structures 104 of the semiconductor device may be arranged in an active portion (or region) 151 of the semiconductor substrate 102. An edge termination portion 153 may laterally surround (or laterally encircle or be formed circumferentially around) the active portion of the semiconductor substrate 102 in the top view, for example.

The plurality of compensation regions 103 may be formed in the active portion 151 of the semiconductor substrate 102. Additionally or optionally, the plurality of compensation regions 103 may extend towards or into the edge termination portion 153 of the semiconductor substrate. Optionally, all the compensations regions 103 may extend towards or into the edge termination portion 153 of the semiconductor substrate.

Optionally, a first group of compensation regions 103 of the plurality of compensation regions 103 may be connected to the SD or MGD structure. For example, the first group of compensation regions 103 of the plurality of compensation regions 103 may be formed at a bottom of a trench structure in which the diode (SD or MGD) structure is formed, as described in connection with FIG. 1B or FIG. 1C.

Optionally or additionally, a second group of compensation regions 103 of the plurality of compensation regions 103 may each be connected to FET structures. For example, the compensation regions 103 of the second group of compensation regions 103 may each be arranged below a source region or body region of a FET structure. For example, the second group of compensation regions 103 of the plurality of compensation regions 103 may be without the SD or MGD structure as described in connection with FIG. 1B or FIG. 1C.

Optionally, the first group of compensation regions 103 and the second group of compensation regions 103 may be arranged alternatingly with respect to each other in the first lateral direction L1. For example, one compensation region 103 (or e.g. two, or e.g. three or more compensation regions 103) from the first group of compensation regions may be located between two neighboring compensation regions of the second group of compensation regions 103.

More details and aspects are mentioned in connection with the embodiments described above or below. The embodiments shown in FIG. 1D may comprise one or more optional additional features corresponding to one or more aspects mentioned in connection with the proposed concept or one or more embodiments described above (e.g. FIGS. 1A to 1C) or below (FIGS. 1E to 10).

Figure 1E:
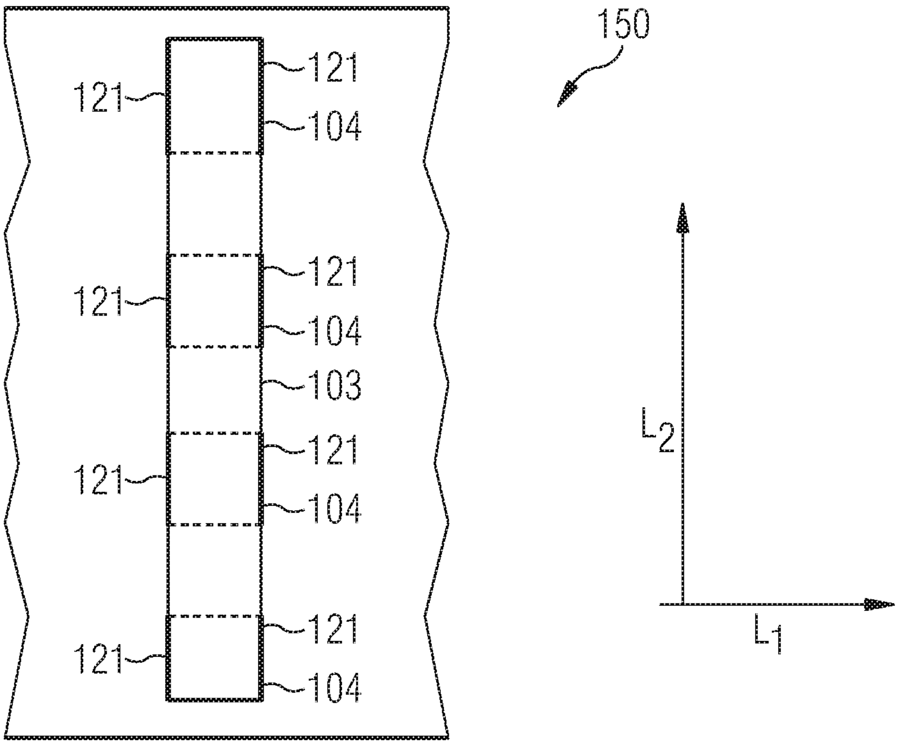
FIG. 1E shows a schematic illustration of a compensation region in a top view.

FIG. 1E shows a schematic illustration of a compensation region 103 in a top view of the semiconductor device 150 according to an embodiment.

As shown in FIG. 1E, a plurality of first portions of the compensation region may be connected to a plurality of diode (SD or MGD) structures 104. Additionally or optionally, a plurality of second portions of the compensation region may be connected to FET structures. For example, instead of the diode structure 104, a plurality of source regions or body regions (of FET structures) may be arranged on the compensation region 103 at the plurality of second portions of the compensation region 103.

Optionally, the plurality of first (or diode) portions of the compensation region 103 and the plurality of second (or transistor) portions of the compensation region 103 may be arranged alternatingly with respect to each other in the second lateral direction L2.

More details and aspects are mentioned in connection with the embodiments described above or below. The embodiments shown in FIG. 1E may comprise one or more optional additional features corresponding to one or more aspects mentioned in connection with the proposed concept or one or more embodiments described above (e.g. FIGS. 1A to 1D) or below (FIGS. 1F to 10).

Figure 1F:
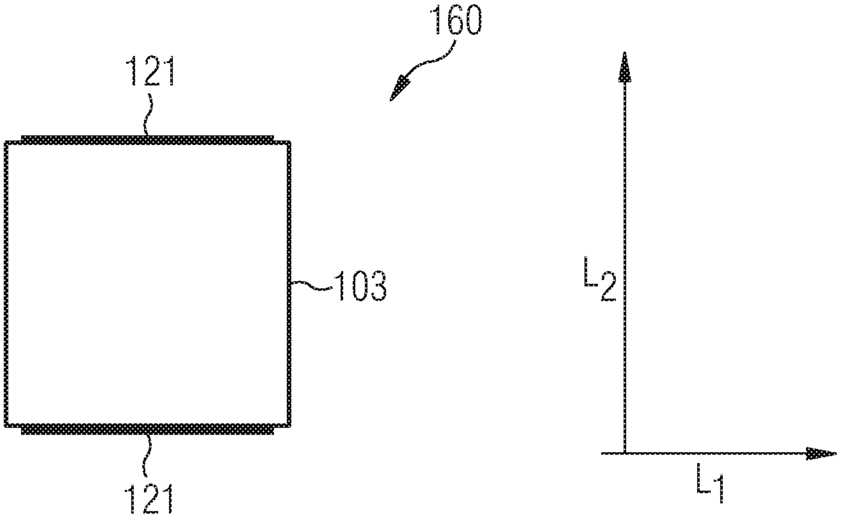
FIG. 1F shows a schematic illustration of a compensation region in a top view.

FIG. 1F shows a schematic illustration of a compensation region 103 in a top view of the semiconductor device 160 according to an embodiment.

As shown in FIG. 1F, the compensation region 103 may have a needle shape in the top view. For example, a ratio of a lateral dimension of the compensation region 103 in the first lateral direction to a lateral dimension of the compensation region in the second lateral direction may be less than 5:1, for example.

The Schottky contact interfaces 121 may be formed on a first pair of sidewalls of a trench structure located on (or above) the compensation region 103. The compensation region 103 may be connected to an FET structure at a second pair of sidewalls, for example.

More details and aspects are mentioned in connection with the embodiments described above or below. The embodiments shown in FIG. 1F may comprise one or more optional additional features corresponding to one or more aspects mentioned in connection with the proposed concept or one or more embodiments described above (e.g. FIGS. 1A to 1E) or below (FIGS. 2A to 10).

FIG. 2A shows a schematic illustration of a semiconductor device 210 according to an embodiment. The semiconductor device 210 may be similar to the semiconductor device 100 described in connection with FIG. 1A.

The semiconductor device 210 may include a plurality of FET structures. In the example shown in FIG. 2A, the plurality of FET structures may be a plurality of JFET structures, for example. Each JFET structure of the plurality of JFET structures may include a source region 233. Each source region 233 of the JFET structure may be located adjacently to a source contact structure 232 at the first lateral surface 229 of the semiconductor substrate 103, for example.

Each source region 233 of the plurality of JFET structures may be located adjacently between the source contact structure 232 and at least part of the shielding doping region 226, for example. The shielding doping region 226 may form a part of the structure controlling the channel 228 of the JFET. For example, the n-channel 228 may be located between the p-doped gate doping region 231 and the shielding doping region 226. Each source region 233 of the JFET structure may be separated from a gate doping region 231 of the JFET structure by a lateral separation distance. At least part of the channel region 228 (e.g. a second portion of the channel region) of the JFET structure may be located in the semiconductor substrate 102 between the source region 233 of the JFET structure and the gate doping region 231 of the JFET structure.

The p-doped gate doping region 231 may be in ohmic contact with the gate electrode and controls the channel region 228, for example. In the off-state, a space-charge region may extend to (or towards) the next p-n junction (e.g. towards the shielding doping region 226), which may deplete the channel region 228 and prevent current flow.

The semiconductor device 210 may include the plurality of compensation regions 103 arranged alternating to the plurality of drift regions 101 (in a cross section orthogonal to a lateral length of the compensation regions).

The semiconductor device 210 may include the diode structure 104 (which may be an SD structure or an MGD structure). In the example shown in FIG. 2A, the diode structures 104 are MGD structures, for example. Each MGD structure 104 may include the gate electrode material 235 and the gate insulation layer 236 arranged in the trench structure 227. The gate insulation (e.g. oxide) layer 236 may be arranged on sidewalls (e.g. on a first vertical sidewall and second vertical sidewall) and at the bottom of the trench structure 227, for example. The electrically conductive gate electrode material 235 (e.g. polysilicon) may be arranged in (or at least partially fill the trench structure 227, such that the gate insulation layer 236 is located between the gate electrode material 235 and the semiconductor substrate 102, for example.

At least part of a (first) sidewall of the trench structure 227 may be arranged adjacently to a drift region 237 (n-type doped) of the MGD diode structure 104 and/or a body region 238 (p-type doped) of the MGD diode structure 104, for example. For example, the drift region 237 of the MGD diode structure 104 and/or the body region 238 of the MGD diode structure 104 may be arranged adjacently to a (first) sidewall of the trench structure 227, for example. The body region 238 of the MGD diode structure 104 may be located between a source region 239 of the MGD diode structure 104 and the drift region 237 of the MGD diode structure, for example. The source region 239 of the MGD diode structure 104 may be located at the (first) sidewall of the trench structure 227 between the body region 238 of the MGD diode structure 104 and the first lateral surface 229 of the semiconductor substrate 102, for example.

The semiconductor device 210 may further include at least one (e.g. one or more) shielding doping regions 226. The (or each) shielding doping region 226 may be arranged adjacently to a sidewall (e.g. a second sidewall opposite to the first sidewall) and/or bottom of a trench structure 227, for example. The shielding doping region 226 may extend deeper into the semiconductor substrate 102 than the trench structure 227, for example. For example, the shielding doping region 226 may extend from the first lateral surface 229 of the semiconductor substrate 102 along the first sidewall of the trench structure 227 to the bottom of the trench structure 227, where a portion of the shielding doping region 226 is formed at the bottom of the trench structure 227.

Each shielding doping region 226 may be arranged between a compensation region 103 of the plurality of compensations regions and the diode structure 104 (e.g. the SD structure or the MGD structure). At least a portion of the (or each) shielding doping region 226 may lie between the first lateral surface 229 of the semiconductor substrate 102 and a compensation region 103. For example, at least a portion of the shielding doping region 226 may be arranged (directly) adjacently between the first lateral surface 229 of the semiconductor substrate 102 and a top side of the compensation region 103.

A first portion of the shielding doping region 226 may have a lateral dimension smaller than a second portion of the shielding doping region 226. For example, the second portion of the shielding doping region may protrude (or extend) laterally from (or compared to) the first portion of the shielding doping region 226. The second portion of the shielding doping region 226 may have a lateral dimension larger than the lateral dimension of the first portion of the shielding doping region 226 and/or the lateral dimension of the compensation region 103, for example. For example, the shielding doping region 226 may be T or L shaped. Optionally, the first portion of the shielding doping region 226 may have a lateral dimension smaller than the lateral dimension of the compensation region 103. Optionally, a (maximum) lateral dimension of at least part of the shielding doping region 226 may be larger than a lateral dimension of the compensation region 103 of the plurality of compensation regions 103, for example. The shielding doping region 226 may control a conductivity of the channel region 228. Without the shielding doping region 226, it may be impossible to turn off the channel even if a high gate blocking voltage is applied to the gate.

The shielding doping region 226 may extend from the portion of the at least one sidewall (e.g. the first sidewall) and/or the bottom of the trench structure 227 towards the channel region 228 of a FET structure of the plurality of FET structures. For example, at least part of the shielding doping region 226 may extend towards or be arranged directly adjacently to the channel region 228 of a JFET structure. For example, the second portion of the shielding doping region 226 may be extend (or protrude) towards the gate doping region 231 arranged adjacently to a transistor gate contact structure 234 of the JFET structure, such that the second portion of the shielding doping region 226 is arranged adjacently to (or in parallel to) the gate doping region 231.

At least part of the channel region 228 of the JFET structure may be arranged between the second portion of the shielding doping region 226 and the gate doping region 231 of the JFET structure. For example, at least part of the channel region 228 arranged in the semiconductor substrate 102 may be substantially horizontal (or parallel) to the surface of the semiconductor substrate 102. For example, the part of the channel region 228 arranged between the second portion of the shielding doping region 226 and the gate doping region 231 of the JFET structure may be substantially horizontal (or parallel) to the surface of the semiconductor substrate 102. In other words, a flow of charge carriers in the horizontal portion of the channel region 228 may be in a direction parallel to the surface of the semiconductor substrate 102, for example.

Each JFET structure may be located between neighboring MGD diode structures 104 and/or between neighboring (or consecutive) shielding doping regions 226, and/or between neighboring compensation regions 103 of the plurality of compensation regions 103, for example.

The semiconductor device 210 may include the source contact structure 232 electrically connected to the plurality of source regions 233 of the plurality of JFET structures at the first lateral surface 229 of the semiconductor substrate 102. The shielding doping regions 226, gate electrode material 235 of the MGD structures 104, the source region of the MGD structures 104 and/or the body regions of the MGD structures 104 may be electrically connected to the source or emitter contact structure 232 at the first lateral surface 229 of the semiconductor substrate 102, for example.

The drain region 125 of the plurality of FET structures having the first conductivity type (e.g. n doped may be located at a second lateral side (e.g. a back surface) of the semiconductor substrate 102, for example. The drain regions 125 of the plurality of FET structures may be electrically connected to the drain contact structure at the second lateral surface of the semiconductor substrate 102.

Optionally, the lateral dimension of the drift regions 101 between the compensation regions 103 may be made narrower. For example, a maximum lateral dimension of a drift region of a FET structure may be equal to a maximum lateral dimension of a compensation region 103, for example.

The JFET channel region 228 may lie between the transistor gate 234 of the JFET structure (or between the gate doping region 231) and the p-type doped shielding doping region 226 at source potential. The semiconductor device 200 may be stable against avalanche because the gate 234 (and the gate doping region 231) may be protected by the shielding doping region 226 from breakthrough caused by high electric fields in the direction towards the gate doping region 231 and the transistor gate 234.

JFET structures may be used in SiC technology as the channel comprises a doping region, and has the high electron mobility of the substrate, in contrast to a SiC MOSFET, in which the mobility in the channel is limited in the on-state in forward bias operation. Thus, the device may have a smaller turn-on resistance. In the forward operation of the body diode, which means that the drain electrode is on a lower potential than the source electrode, the electrons from the drain must overcome the high barrier to the p-type SiC (shielding doping region 226 at source potential) at negative gate source voltage (JFET channel cut off), which may generate high conduction losses due to the bandgap.

The MGD structure 104 having a low forward threshold voltage may help to remove electrons from the drain region 125. The gate electrode material 235 of the MGD structure 104 may be formed in the trench structure 227 and a source potential may be applied to the gate electrode material 235. The gate electrode material 235 of the MGD structure 104 may be separated from the body region 238 doped with material of the second conductivity type (e.g. p-type doped) of the MGD structure 104 and the source region 239 doped with material of the first conductivity type (e.g. n-type doped) of the MGD structure 104 above (or adjacent to) the p-type region (the body region) by the gate insulation layer 236 (e.g. a dielectric layer). The body region 238 of the MGD structure 104 and the source region 239 of the MGD structure 104 may be connected to the source contact structure 232 (source electrode), for example.

When the potential in the drift zone is reduced, the potential directly at the p-n junction (between the body region 238 of the MGD structure and the drift region 237 of the MGD structure) under the source potential may also be reduced. Thus, an n-channel may be formed or controlled by suitable doping of the p-type doped body region 238 of the MGD structure, and by a suitable dimensioning of the thickness of the gate insulation layer 236 (dielectric). The n-channel may conduct electrons from the drain (e.g. the drain region) directly to the n-source region (the source region) without the p-n junction being operated in a forward direction and injecting holes, for example.

The use of SiC may further ease the dimensioning of the MGD cell due to the large band gap in comparison to silicon (Si). At high current densities of the body diode structure 104 and with high channel voltage drop and channel mobility, the p-n junction may be established which may lead to a reduced increase of the forward voltage at higher forward currents and to a good surge current strength of the body diode structure 104.

More details and aspects are mentioned in connection with the embodiments described above or below. The embodiments shown in FIG. 2A may comprise one or more optional additional features corresponding to one or more aspects mentioned in connection with the proposed concept or one or more embodiments described above (e.g. FIGS. 1A to 1C) or below (FIGS. 2B to 10).

Figure 2B:
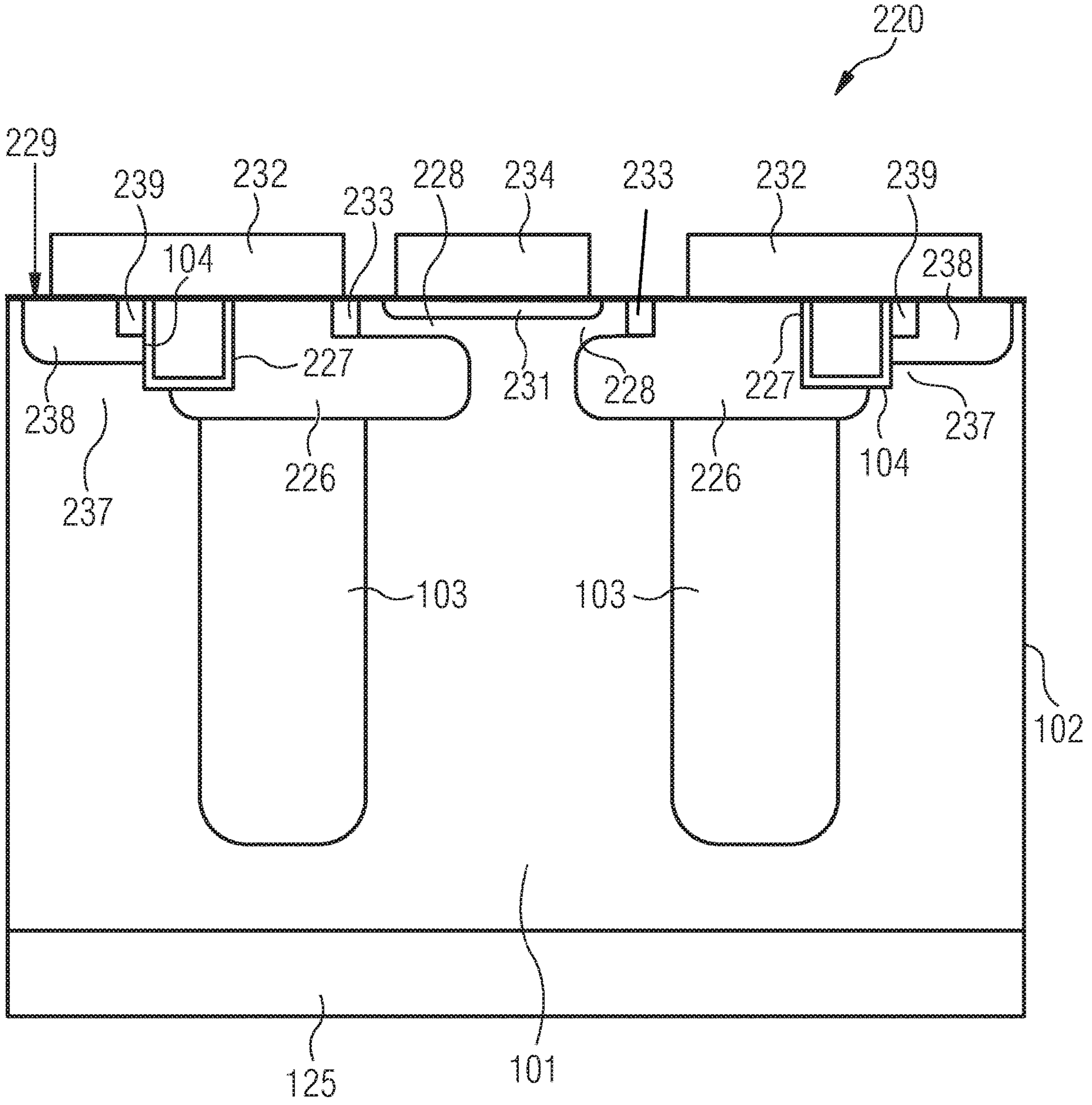
FIG. 2B shows a schematic illustration of a further semiconductor device having a plurality of junction field effect transistor structures.

FIG. 2B shows a schematic illustration of a semiconductor device 220 according to an embodiment. The semiconductor device 220 may be similar to the semiconductor device described in connection with FIG. 2A For example, the semiconductor device 220 may include one or more or all of the features described in connection with the semiconductor device of FIG. 2A.

The semiconductor device 220 may include two JFET structures arranged between consecutive (or neighboring) diode structures 104 arranged consecutively in a lateral direction. For example, the semiconductor device 220 may include two JFET structures arranged between neighboring shielding doping regions 226 arranged consecutively in a lateral direction. For example, the two JFET structures may have a common (or shared) transistor gate and/or a common (or shared) gate doping region 231. For example, a channel region 228 of the first JFET structure and a channel region 228 of the second JFET structure may be arranged between a source region 233 of the first JFET structure and a first source region 233 of the second JFET structure. For example, the channel region 228 of the first JFET structure may be arranged between a first portion of the gate doping region 231 and a first shielding doping region 226. For example, the channel region 228 of the second JFET structure may be formed between a second (different) portion of the same gate doping region 231 and a second (different) shielding doping region 226. The source region 233 of the first JFET structure and the source region 233 of the second JFET structure may be located between the first shielding doping region 226 and the second (neighboring or consecutive) shielding doping region 226 in the first lateral direction, for example. Optionally, the pair of JFET structures may be repeatedly arranged laterally in the semiconductor substrate. Optionally a body region 238 of a MGD diode structure 104 and a body region 238 of a neighboring MGD diode structure 104 may overlap between each pair of JFET structures. For example, a continuous body region 238 of a first MGD diode structure 104 and a second MGD diode structure 104 may be arranged between each pair of JFET structures.

More details and aspects are mentioned in connection with the embodiments described above or below. The embodiments shown in FIG. 2B may comprise one or more optional additional features corresponding to one or more aspects mentioned in connection with the proposed concept or one or more embodiments described above (e.g. FIGS. 1A to 2A) or below (FIGS. 2C to 10).

Figure 2C:
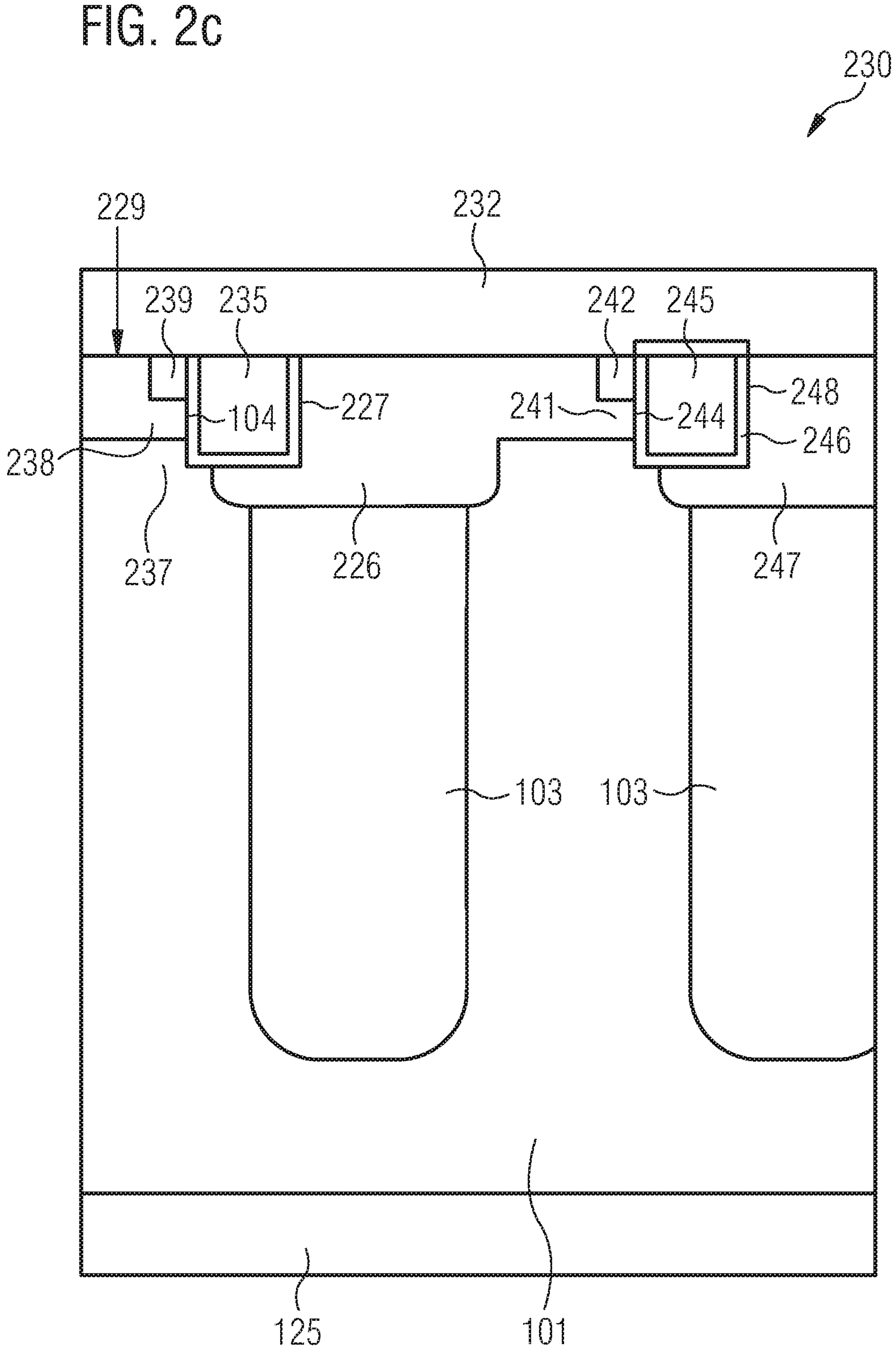
FIG. 2C shows a schematic illustration of a further semiconductor device having a metal oxide semiconductor field effect transistor structure and a metal-insulation-semiconductor gated diode structure.

FIG. 2C shows a schematic illustration of a semiconductor device 230 according to an embodiment. In the example shown in FIG. 2C, the plurality of FET structures may be a plurality of MOSFET or IGBT structures, for example.

Each MOSFET structure may include a transistor gate 244. The transistor gate 244 may include a transistor gate electrode material 245 and a transistor gate insulation layer 246 arranged in a gate trench structure 248. The transistor gate insulation (e.g. oxide) layer 246 may be arranged on sidewalls (e.g. on a first vertical sidewall and second vertical sidewall) and at the bottom of the gate trench structure 248. The electrically conductive transistor gate electrode material 245 (e.g. polysilicon) may be arranged in (or at least partially fill the gate trench structure 248, such that the transistor gate insulation layer 246 is located between the transistor gate electrode material 245 and the semiconductor substrate 102, for example. The transistor gate 244 of the MOSFET structure may be isolated from the source region by a (thicker) gate dielectric and may be connected in the plane externally with an electrode (e.g. a gate contact structure.

At least part of at least one sidewall of the gate trench structure 248 may be arranged adjacently to a drift region 101 of a first conductivity type (e.g. n-type doped) of the MOSFET or IGBT structure and/or a body region 241 of a second conductivity type (e. g. p-type doped) of the MOSFET or IGBT structure. For example, the drift region 101 of the MOSFET or IGBT structure and/or the body region 241 of the MOSFET or IGBT structure may be arranged adjacently to a (first) sidewall of the gate trench structure 248. The body region 241 of the MOSFET or IGBT structure may be located between a source or emitter region 242 of the MOSFET or IGBT structure and the drift region 101 of the MOSFET or IGBT structure. The source or emitter region 242 of the MOSFET or IGBT structure may be located at the (first) sidewall of the gate trench structure 248 between the body region 241 of the MOSFET or IGBT structure and the first lateral surface 229 of the semiconductor substrate 102.

Optionally, the body region 241 of the MOSFET or IGBT structure may be connected (e.g. electrically connected) to the shielding doping region 226 located at the sidewall of the trench structure 227. For example, the body region 241 of the MOSFET or IGBT structure and the shielding doping region 226 may be located adjacently to each other or may form a common doping region. Optionally, the body region 241 of the MOSFET or IGBT structure and the shielding doping region 226 may have the same doping concentration.

The semiconductor device 230 may further include at least one (e.g. one or more) transistor gate shielding doping regions 247. The (or each) transistor gate shielding doping region 247 may be arranged adjacently to at least one sidewall (e.g. a second sidewall opposite to the first sidewall) and/or bottom of a transistor gate trench structure 248. The transistor gate shielding doping region 247 may extend deeper into the semiconductor substrate 102 than the transistor gate trench structure 248. For example, the transistor gate shielding doping region 247 may extend from the first lateral surface 229 of the semiconductor substrate 102 along the first sidewall of the transistor gate trench structure 248 to the bottom of the transistor gate trench structure 248, where a portion of the transistor gate shielding doping region 247 is formed at the bottom of the transistor gate trench structure 248.

The transistor gate shielding doping region 247 may be arranged adjacently between a compensation region 103 of the plurality of compensations regions and the transistor gate trench structure 248. At least a portion of the (or each) transistor gate shielding doping region 247 may lie between the first lateral surface 229 of the semiconductor substrate 102 and a top side of the compensation region 103. For example, at least a portion of the transistor gate shielding doping region 247 may be arranged (directly) adjacently between the first lateral surface 229 of the semiconductor substrate 102 and the compensation region 103.

Optionally, the transistor gate shielding doping region 247 may have the same conductivity type and/or doping concentration as the shielding doping region 226. The transistor gate shielding doping region 247 may have similar (or identical) dimensions as the shielding doping regions 226.

Optionally, the gate shielding doping region 247 and/or the shielding doping region 226 may be in ohmic contact with the body and/or source potential of the transistor. This may be beneficial when the gate shielding doping region 247 and/or the shielding doping region 226 may serve to electrically connect the compensation region 103 to the source potential as e.g. shown in FIG. 2C. However, this is not necessarily the case. The gate shielding doping region 247 and/or the shielding doping region 226 may only be maintained at a voltage which does not differ too much from the voltage of the gate electrode 245 and/or the gate electrode 235 of the MGD structure in order to not overstress the transistor gate insulation layer 246 and/or the gate insulation layer 236. This also may be accomplished, e.g., by only a small gap between the gate shielding doping region 247 and/or the shielding doping region 226 with a low doping of the opposite conductivity type, e.g. the doping of the drift region 102.

More details and aspects are mentioned in connection with the embodiments described above or below. The embodiments shown in FIG. 2C may comprise one or more optional additional features corresponding to one or more aspects mentioned in connection with the proposed concept or one or more embodiments described above (e.g. FIGS. 1A to 2B) or below (FIGS. 2D to 10).

Figure 2D:
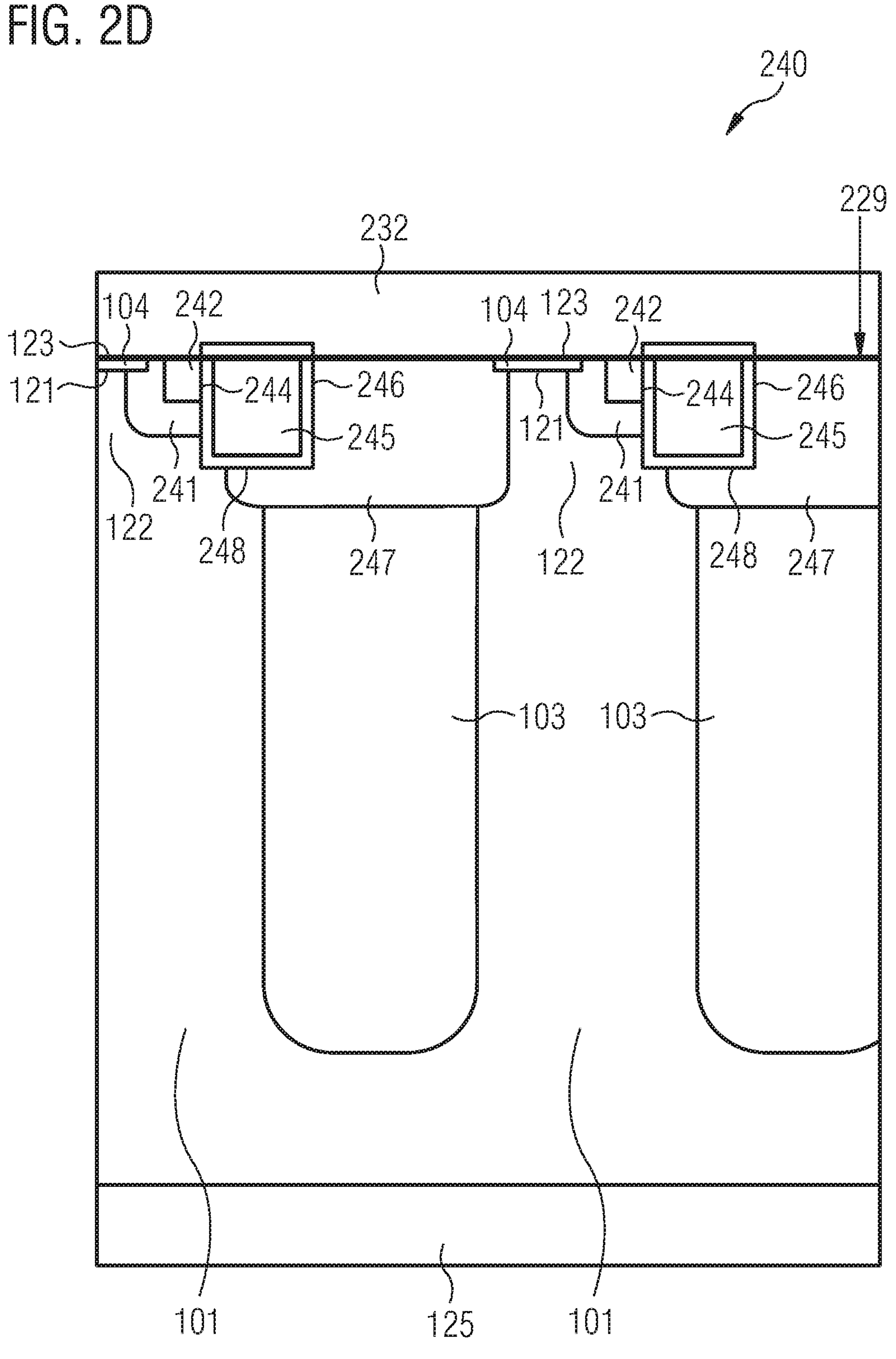
FIG. 2D shows a schematic illustration of a semiconductor device having at least one metal oxide semiconductor field effect transistor structure and at least one Schottky diode structure.

FIG. 2D shows a schematic illustration of a semiconductor device 240 according to an embodiment. In the example shown in FIG. 2D, the plurality of FET structures may be a plurality of MOSFET or IGBT structures, for example.

The diode structure 104 arranged between two neighboring (vertical) MOSFET structures is shown in FIG. 2D. The diode structure 104 may be a SD structure 104. The SD structure 104 may include a Schottky contact 123 which may form a Schottky contact interface 121 with portion of the semiconductor substrate 102, for example. The Schottky contact 123 may be located at (or on or above) the first lateral surface 229 of the semiconductor substrate 102. The Schottky contact interface 121 may extend along the first lateral surface 229 of the semiconductor substrate 102, for example. The Schottky interface 121 may be located between the Schottky contact 123 and the drift region 122 of the Schottky diode structure 104. The Schottky contact interface 121 may be arranged at the first lateral surface 229 of the semiconductor substrate 102 between the Schottky contact 123 and the semiconductor substrate 102, for example.

The Schottky contact 123 and the Schottky contact interface 121 may extend laterally long the first lateral surface 229 of the semiconductor substrate 102 from a gate shielding doping region 247 arranged adjacently to at least one sidewall and/or bottom of a transistor gate trench structure 248 of a first (vertical) MOSFET structure towards a second neighboring (vertical) MOSFET structure. For example, the Schottky contact 123 and the Schottky contact interface 121 may extend laterally from the gate shielding doping region 247 of the first MOSFET structure towards (or to) a body region 241 of the second MOSFET structure. A first portion of the Schottky contact 123 may overlap the gate shielding doping region 247 of the first MOSFET structure at the first lateral surface 229 of the semiconductor substrate 102. A second portion of the Schottky contact 123 may overlap the body region 241 of the second MOSFET structure at the first lateral surface 229 of the semiconductor substrate 102. For example, the first portion of the laterally extending Schottky contact 123 may be arranged (vertically) between the gate shielding doping region 247 of the first MOSFET structure and the source contact structure 232 located at the first lateral surface 229 of the semiconductor substrate 102. For example, the second portion of the laterally extending Schottky contact 123 may be arranged (vertically) between the body region 241 of the second MOSFET structure and the first source contact structure 232 located at the first lateral surface 229 of the semiconductor substrate 102.

A (maximum) thickness of the laterally extending Schottky contact 123 may be less than 300 nm (or e.g. less than 200 nm, or e.g. less than 100 nm), for example. Power metallization located on or above the Schottky contact 123 may have a thickness of between 2 μm and 10 μm. It may be understood that optionally, the Schottky contact 123 may be formed in the trench structure described in connection with FIGS. 1A to 2C.

More details and aspects are mentioned in connection with the embodiments described above or below. The embodiments shown in FIG. 2D may comprise one or more optional additional features corresponding to one or more aspects mentioned in connection with the proposed concept or one or more embodiments described above (e.g. FIGS. 1A to 2C) or below (FIGS. 2E to 10).

Figure 2E:
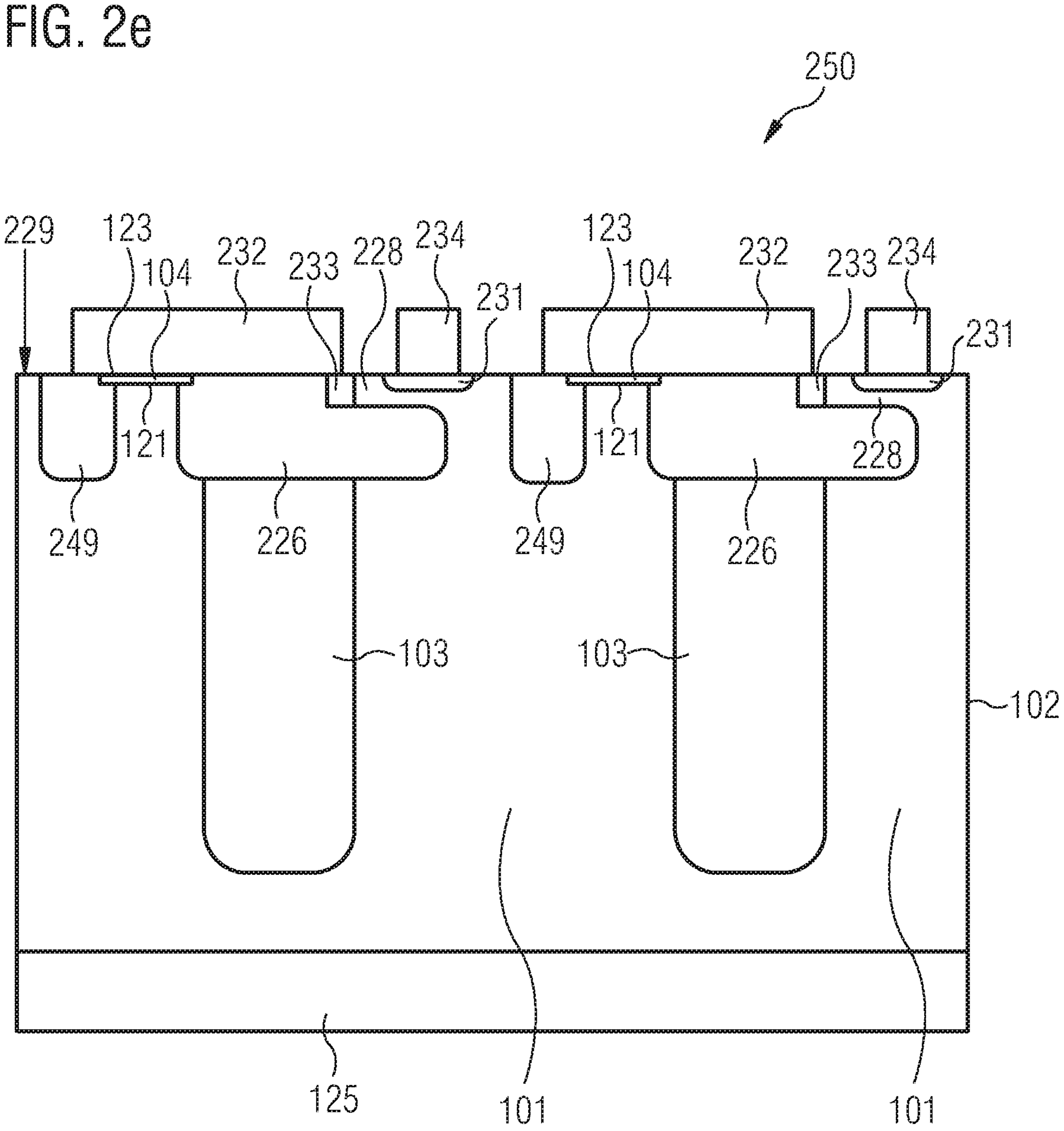
FIG. 2E shows a schematic illustration of a semiconductor device having at least one junction field effect transistor structure and at least one Schottky diode structure.

FIG. 2E shows a schematic illustration of a semiconductor device 250 according to an embodiment. In the example shown in FIG. 2E, the plurality of FET structures may be a plurality of JFET structures, for example.

The Schottky contact 123 may be located between neighboring (vertical) JFET structures. The JFET structures may be similar to the JFET structures described in connection with FIG. 2A for example. For example, each JFET structure may include the first source region 233 located adjacently to at least part of the shielding doping region 226, for example. Each JFET structure may include the gate doping region 231 and a channel region 228 located in the semiconductor substrate 102, for example.

The Schottky contact 123 and/or Schottky contact interface 121 may extend laterally along the first lateral surface 229 of the semiconductor substrate 102 between a (first) shielding doping region 226 and a (substantially) vertically extending shielding doping region 249, for example.

The vertically extending shielding doping region 249 may be a doping region extending from the first lateral surface 229 of the semiconductor substrate 102 (substantially) vertically into the semiconductor substrate 102. The vertically extending shielding doping region 249 may be arranged located between a first diode structure 104 and a second (neighboring) diode structure 104. For example, the vertically extending shielding doping region 249 may be arranged between a (first) shielding doping region 226 located adjacently to a first diode structure 104 and a (first) shielding doping region 226 located adjacently to a neighboring (consecutive) second diode structure 104. The vertically extending shielding doping region 249 may be arranged between a gate doping region 231 of a first JFET structure and (first) shielding doping region 226 located adjacently to a source region 233 of a neighboring second JFET structure.

The Schottky contact 123 and/or the Schottky contact interface 121 may extend laterally from the shielding doping region 226 towards (or to) the vertically extending shielding doping region 249, for example. The first shielding doping region 226 may be arranged between a compensation region 103 of the plurality of compensations regions and the diode structure 104, for example. A first portion of the Schottky contact 123 may overlap the shielding doping region 226 at the first lateral surface 229 of the semiconductor substrate 102. A second portion of the Schottky contact 123 may overlap the vertically extending shielding doping region 249 at the first lateral surface 229 of the semiconductor substrate 102. For example, the first portion of the laterally extending Schottky contact 123 may be arranged (vertically) between the shielding doping region 226 of the first MOSFET structure and the first source contact structure 232 located at the first lateral surface 229 of the semiconductor substrate 102. For example, the second portion of the laterally extending Schottky contact 123 may be arranged (vertically) between the vertically extending shielding doping region 249 and the first source contact structure 232 located at the first lateral surface 229 of the semiconductor substrate 102.

The vertically extending shielding doping region 249 may comprise (or have) the second conductivity type (e.g. p-type doped). A doping concentration of the vertically extending shielding doping region 249 may be higher than a doping concentration of the plurality compensation regions. For example, the vertically extending shielding doping region 249 may have a net doping concentration of greater than $1\times10^{16}$ dopant atoms per $cm^3$ (or e.g. greater than $1\times10^{17}$ dopant atoms per $cm^3$, or e.g. greater than $1\times10^{18}$ dopant atoms per $cm^3$). Optionally, the vertically extending shielding doping region 249 may have the same (or similar) doping concentration as the shielding doping region 226, for example.

More details and aspects are mentioned in connection with the embodiments described above or below. The embodiments shown in FIG. 2E may comprise one or more optional additional features corresponding to one or more aspects mentioned in connection with the proposed concept or one or more embodiments described above (e.g. FIGS. 1A to 2D) or below (FIGS. 2F to 10).

Figure 2F:
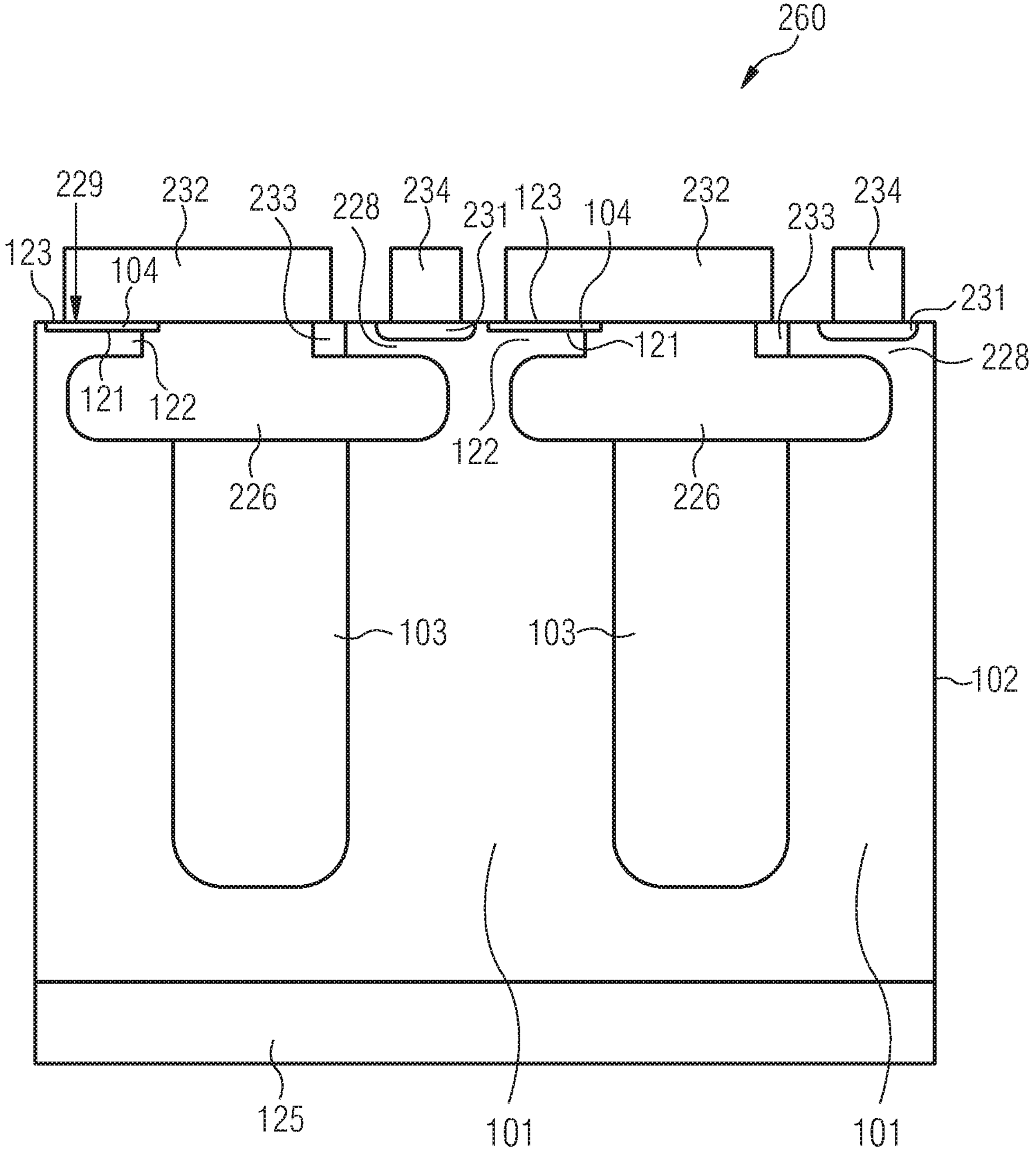
FIG. 2F shows a schematic illustration of a further semiconductor device having at least one junction field effect transistor structure and at least one Schottky diode structure.

FIG. 2F shows a schematic illustration of a semiconductor device 260 according to an embodiment. The semiconductor device 260 may be similar to the semiconductor device described in connection with FIG. 2E.

The vertically extending shielding doping region 249 may be omitted as shown in FIG. 2E. The shielding doping region 226 may be a T-shaped structure, for example. The shielding doping region 226 may include a first portion extending vertically from the first lateral surface 229 of the semiconductor substrate 102 towards (or to) the compensation region 103 adjacent to the shielding doping region 226. A second portion of the shielding doping region 226 may protrude (or extend) laterally from the first portion of the shielding doping region 226 towards the channel region 228 of the first JFET structure. At least part of the channel region 228 of the JFET structure may be arranged between the second portion of the shielding doping region 226 and the gate doping region 231 of the JFET structure. The second portion of the shielding doping region 226 may extend laterally such that the second portion of the shielding doping region 226 is arranged in parallel to more than 50% of the laterally extending gate doping region 231 of the JFET.

A third portion of the shielding doping region 226 may optionally protrude (or extend) laterally from the first portion of the shielding doping region 226 in a direction opposite to the second portion of the shielding doping region 226. The third portion of the shielding doping region 226 may extend towards a neighboring shielding doping region 226 and/or a neighboring second JFET structure. At least part of the (n-doped) drift region 122 of the Schottky diode structure 104 may be arranged laterally between the Schottky contact 123 and the third portion of the shielding doping region 226, for example.

The third portion of the shielding doping region 226 does not extend further in the direction of the gate doping region 231 as the compensation region 103, for example. The lateral distance between the second portion of a first shielding doping region 226 and a third portion of a neighboring second shielding doping region 226 may be controlled as the lateral distance determines the reach (or the break-through) of the electric field in the direction of the gate 234 and the Schottky contact 123.

More details and aspects are mentioned in connection with the embodiments described above or below. The embodiments shown in FIG. 2F may comprise one or more optional additional features corresponding to one or more aspects mentioned in connection with the proposed concept or one or more embodiments described above (e.g. FIGS. 1A to 2E) or below (FIGS. 2G to 10).

Figure 2G:
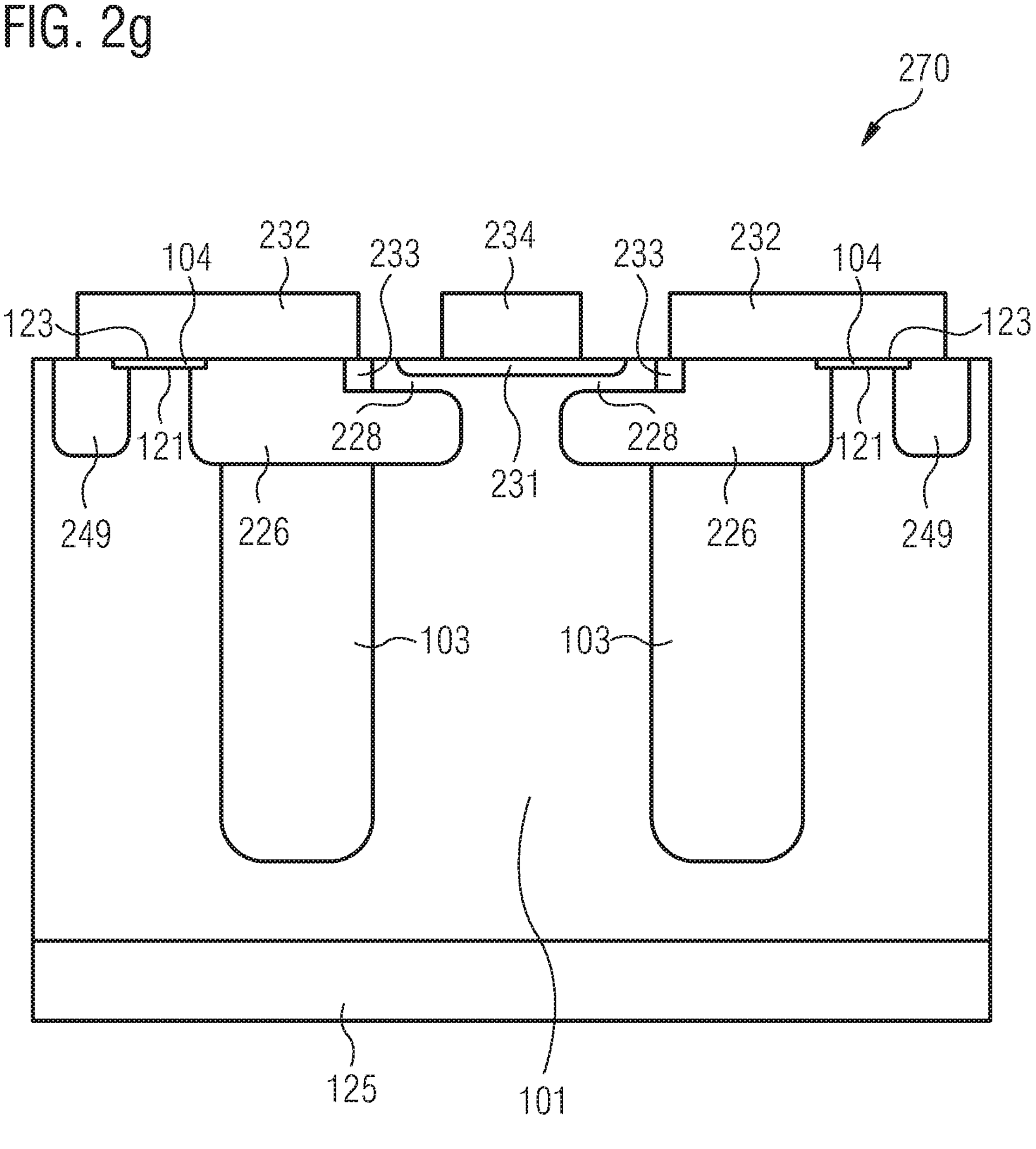
FIG. 2G shows a schematic illustration of a further semiconductor device having at least one junction field effect transistor structure and at least one further shielding doping region.

FIG. 2G shows a schematic illustration of a semiconductor device 270 according to an embodiment.

Similarly to the semiconductor device described in connection with FIG. 2B, the semiconductor device 270 may include two JFET structures arranged between consecutive (or neighboring) diode structures 104 arranged consecutively in a lateral direction. For example, the semiconductor device 270 may include two JFET structures arranged between neighboring shielding doping regions 226 arranged consecutively in a lateral direction. For example, two JFET structures may be arranged between a shielding doping region 226 adjacent to a first diode structure 104 and a shielding doping region 226 adjacent to a neighboring second diode structure 104. For example, the two JFET structures may have a common (or shared) transistor gate and/or a common (or shared) gate doping region 231.

Similarly to the semiconductor device described in connection with FIG. 2E, the Schottky contact 123 and/or Schottky contact interface 121 of the diode structure 104 may extend laterally long the first lateral surface 229 of the semiconductor substrate 102 between a (first) shielding doping region 226 and a vertically extending shielding doping region 249, for example. Optionally, each vertically extending shielding doping region 249 may be located between a shielding doping region 226 of a first JFET structure and a shielding doping region 226 of neighboring second JFET structure.

The various examples described in connection with FIGS. 2A to 2G each show different arrangements of diode structures 104 and FET structures with respect to each other. In some examples, the MGD/SD cells and the MOSFET/JFET cells are shown to be directly adjacent to each other. For example, each MGD/SD structure 104 may be adjacent to a MOSFET/JFET structure (an MGD-MOSFET-MGD-MOSFET arrangement). In some examples, the semiconductor device may include repeated blocks of two (or more) laterally adjacent MOSFET/JFET cell structures for every one (or more) laterally adjacent MGD/SD structure 104 (e.g. two MOS cells for every one MGD cell, or e.g. a MOSFET-MOSFET-MGD-MOSFET-MOSFET-MGD arrangement). Alternatively or optionally, the semiconductor device may include repeated blocks of three laterally adjacent MOSFET/JFET cell structures for every two laterally adjacent MGD/SD structure 104 (e.g. three MOS cells for every two MGD cells, or e.g. a MOSFET-MOSFET-MOSFET-MGD-MGD-MOSFET-MOSFET-MOSFET-MGD-MGD arrangement). Alternatively or optionally, the semiconductor device may include repeated blocks of one MOSFET/JFET cell structures for every two laterally adjacent MGD/SD structures 104 (e.g. one MOS cell for every two MGD cells, or e.g. a MOSFET-MGD-MGD-MOSFET-MGD-MGD arrangement). Alternatively or optionally, the MOSFET/JFET and MGD/SD cells may be arranged laterally alternatingly in a lateral direction. Alternatively or optionally, two, or three or four MOSFET/JFET cells may be arranged laterally adjacent to a plurality of MGD/SD cells.

The pitch of the MOSFET/JFET and MGD/SD diode cells may vary e.g. depending on the required current-carrying capacity of the diodes in comparison to the MOSFET or JFET structures. A mixed arrangement of MOSFET/JFET and MGD/SD cells may improve the thermal capability of the transistor, as they may be respectively alternatingly activated, and the neighboring inactive portion of the chip may be used for heat spreading, for example.

More details and aspects are mentioned in connection with the embodiments described above or below. The embodiments shown in FIG. 2G may comprise one or more optional additional features corresponding to one or more aspects mentioned in connection with the proposed concept or one or more embodiments described above (e.g. FIGS. 1A to 2F) or below (FIGS. 3A to 10).

Figure 3A:
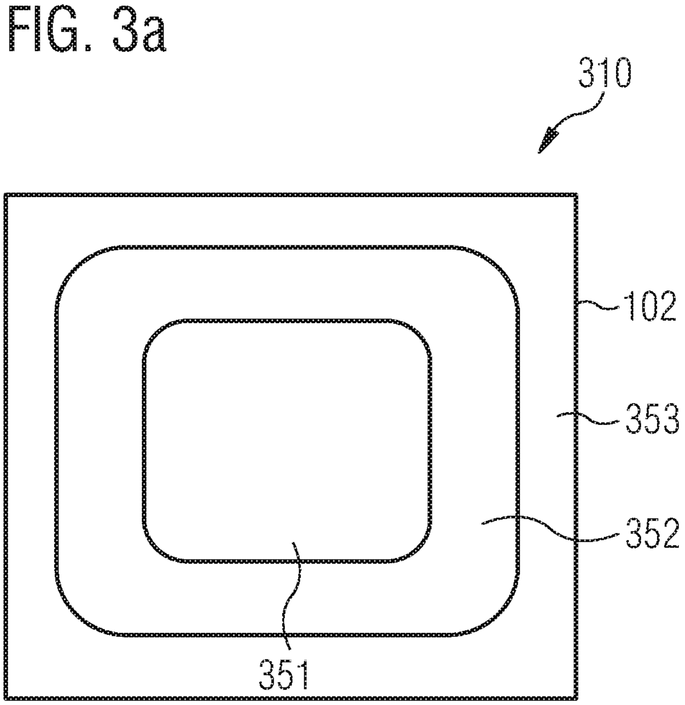
FIGS. 3A to 3C show schematic illustrations of possible layouts of a semiconductor device.
Figure 3B:
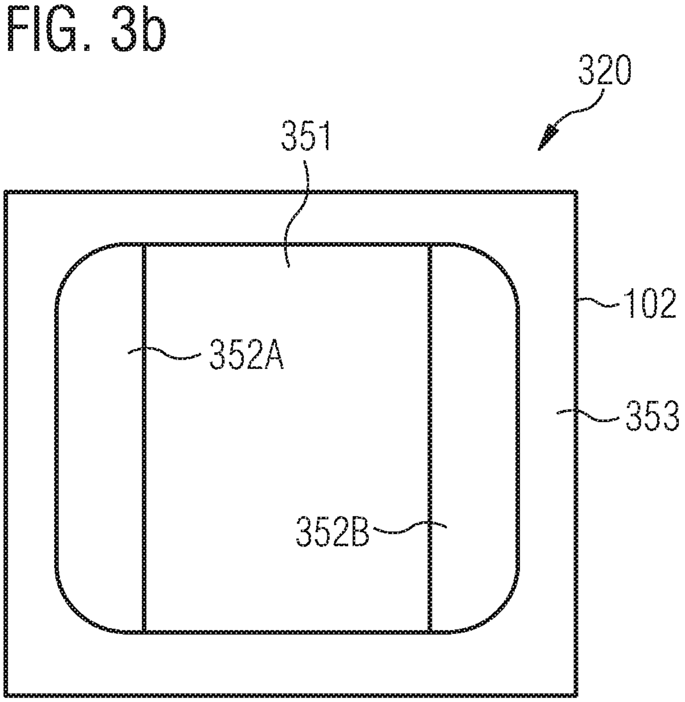
Figure 3C:
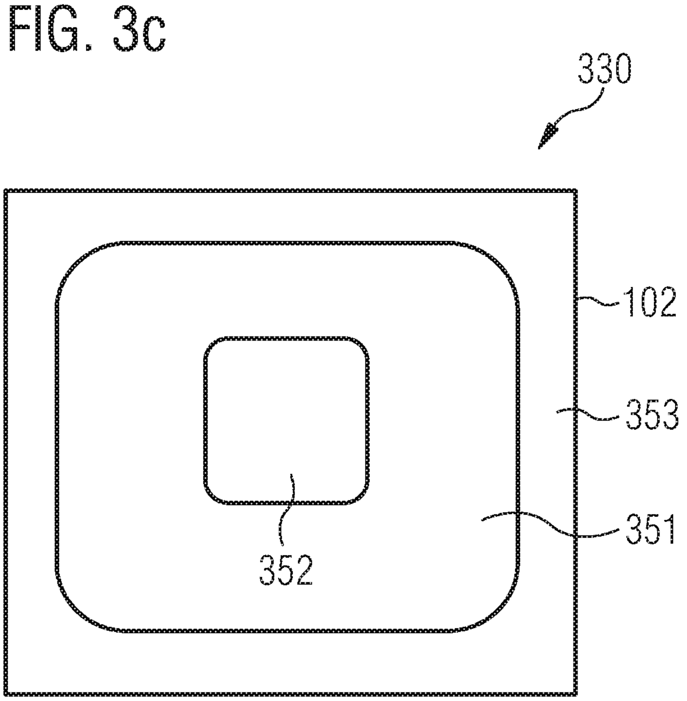

FIGS. 3A to 3C show schematic top view illustrations of possible layouts for a semiconductor device according to various embodiments. For example, FIGS. 3A to 3C show that MOSFET/JFET structures and MGD/SD structures may be separated in large blocks in different regions of the semiconductor substrate 102.

FIG. 3A shows a schematic top view illustration of a layout of a semiconductor device 310.

The plurality of FET structures of the semiconductor device 310 may be arranged in a first portion 351 (e.g. a transistor cell region) of the semiconductor substrate 102. The diode structures 104 of the semiconductor device 310 may be formed in a second portion 352 of the semiconductor substrate 102. The second portion 352 of the semiconductor substrate 102 may laterally surround the first portion 351 of the semiconductor substrate 102 in the top view. An edge termination portion 353 may laterally surround (or laterally encircle or be formed circumferentially around) the second portion of the semiconductor substrate 102 in the top view, for example.

FIG. 3B shows a schematic top view illustration of a layout of a semiconductor device 320.

The plurality of FET structures of the semiconductor device 310 may be arranged in a first portion 351 (e.g. a transistor cell region) of the semiconductor substrate 102. The diode structures 104 of the semiconductor device 310 may be formed in a second portion 352A of the semiconductor substrate 102 and a third portion 352A of the semiconductor substrate. The second portion 352A of the semiconductor substrate 102 may be formed at (or adjacently to) a first lateral side of the first portion 351 of the semiconductor substrate 102 in the top view. The third portion 352B of the semiconductor substrate 102 may be formed at (or adjacently to) a second lateral side (opposite to the first lateral side) of the first portion 351 of the semiconductor substrate 102 in the top view. An edge termination portion 353 may laterally surround (or laterally encircle or be formed circumferentially around) the second portion 352A of the semiconductor substrate 102, the third portion 352B of the semiconductor substrate 102 and the first portion 352A of the semiconductor substrate 102 in the top view, for example.

FIG. 3C shows a schematic top view illustration of a layout of a semiconductor device 330.

The plurality of FET structures of the semiconductor device 310 may be arranged in a first portion 351 (e.g. a transistor cell region) of the semiconductor substrate 102. The diode structures 104 of the semiconductor device 310 may be formed in a second portion 352 of the semiconductor substrate 102. The first portion 351 of the semiconductor substrate 102 may laterally surround the second portion 352 of the semiconductor substrate 102 in the top view. An edge termination portion 353 may laterally surround (or laterally encircle or be formed circumferentially around) the first portion of the semiconductor substrate 102 in the top view, for example.

More details and aspects are mentioned in connection with the embodiments described above or below. The embodiments shown in FIGS. 3A to 3C may each comprise one or more optional additional features corresponding to one or more aspects mentioned in connection with the proposed concept or one or more embodiments described above (e.g. FIGS. 1A to 2G) or below (FIGS. 4 to 10).

Figure 4:
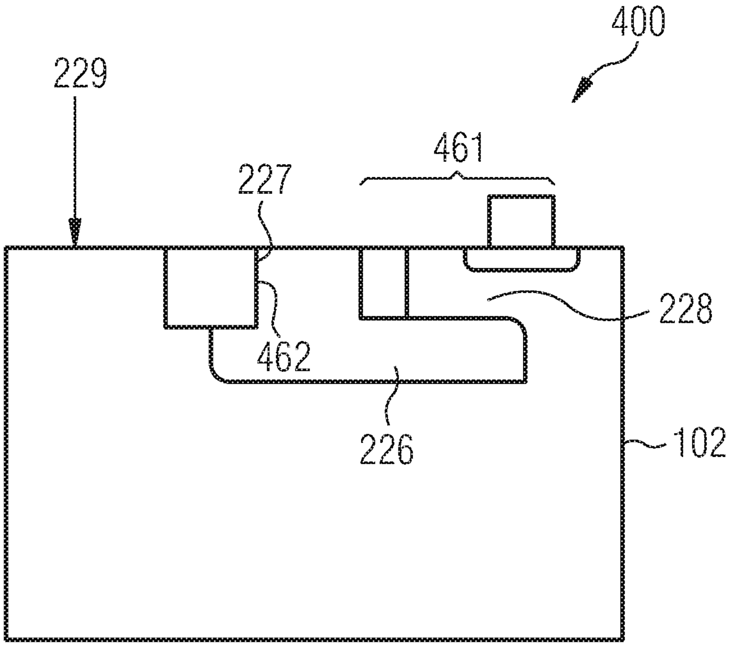
FIG. 4 shows a schematic illustration of a semiconductor device having a trench structure.

FIG. 4 shows a schematic illustration of a semiconductor device 400 according to an embodiment.

The semiconductor device 400 comprises a field effect transistor structure 461 arranged at a semiconductor substrate 102.

The semiconductor device 400 further comprises a trench structure 227 extending from a surface 229 of the semiconductor substrate 102 into the semiconductor substrate 102. The trench structure 227 comprises a Schottky contact interface of a Schottky diode structure or a gate of a metal-insulation-semiconductor gated diode structure within the trench structure 227.

The semiconductor device 400 further comprises a shielding doping region 226 extending from a portion of at least one sidewall 462 of the trench structure 227 towards a channel region 228 of the field effect transistor structure 461.

Due to the semiconductor device 400 comprising the Schottky contact interface of a Schottky diode structure or the gate of a metal-insulation-semiconductor gated diode structure, a unipolar current path having a smaller forward voltage than a bipolar/p-n body diode between drift region and a body region may be provided. This may lead to switching losses of the semiconductor device 400 being reduced, switching speeds being increased and/or a forward voltage drop or forward losses being improved, for example. Due to the shielding doping region 226 extending from a portion of at least one sidewall 462 of the trench structure 227 towards a channel region 228 of the field effect transistor structure 461, a gate of the field effect transistor structure 461 may be protected by the shielding doping region 226 from breakthrough caused by high electric fields in the direction towards the gate.

The semiconductor device 400 may be similar to the semiconductor devices described in connection with FIGS. 1A to 3C.

The field effect transistor structure 461 may be a metal oxide semiconductor field effect transistor (MOSFET) structure, an insulated gate bipolar transistor (IGBT) structure, or a junction field effect transistor (JFET) structure, for example.

The Schottky diode structure may include a Schottky contact forming a Schottky contact interface (e.g. a Schottky junction) with portion of the semiconductor substrate 102, for example. The Schottky interface may be located between the Schottky contact and a drift region of the Schottky diode structure (at a first sidewall of the trench structure 227), for example. The drift region of the SD structure may be part of a common drift zone of the semiconductor substrate 102, for example.

The gate of the MGD structure may be arranged adjacently to a drift region of a first conductivity type (e.g. n-type doped) of the MGD structure 104 and/or a body region of a second conductivity type (e.g. p-type doped) of the MGD diode structure 104 (at the first sidewall of the trench structure 227). The drift region of the MGD structure 104 may be part of a common drift zone of the semiconductor substrate 102, for example.

The (first) sidewall of the trench structure 227 may be arranged adjacently to the drift region of the SD structure or to the drift region of the MGD structure 104, for example. The shielding doping region 226 may be arranged adjacently to at least one sidewall (e.g. a second sidewall opposite to the first sidewall) and/or bottom of a trench structure 227, for example. The shielding doping region 226 may extend deeper into the semiconductor substrate than the trench structure 227, for example.

At least part of the channel region 228 arranged in the semiconductor substrate 102 may be substantially horizontal to the surface 229 of the semiconductor substrate 102, for example.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1A to 2C) or below (FIGS. 5A to 10).

Figure 5A:
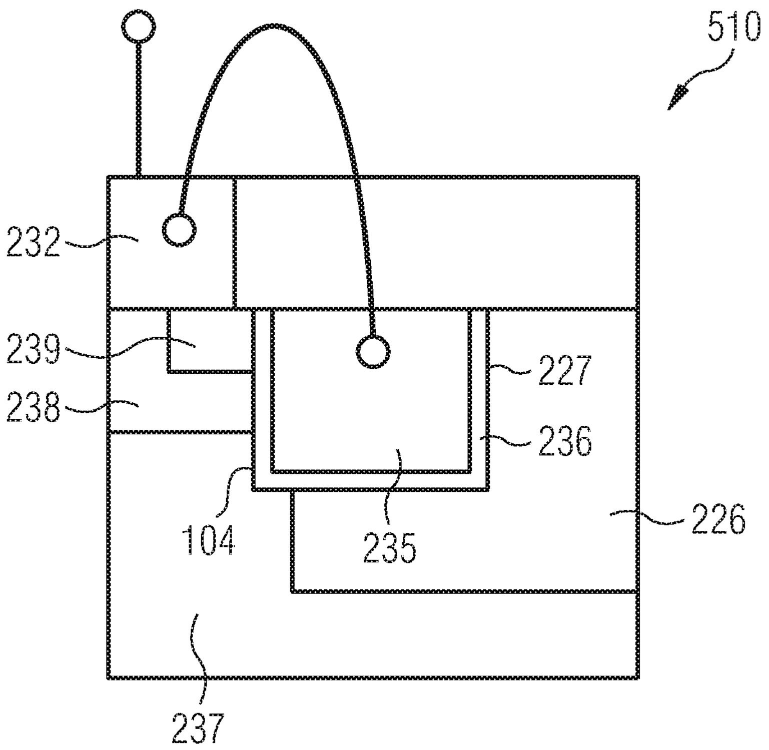
FIG. 5A shows a schematic illustration of a semiconductor device having a metal-insulation-semiconductor gated diode structure.

FIG. 5A shows a schematic illustration of a semiconductor device 510 according to an embodiment.

The semiconductor device 510 may include the trench structure 227 comprising a gate of a metal-insulation-semiconductor gated diode structure 104 within the trench structure 227. The gate of the MGD structure 104 may include the gate electrode material 235 and the gate insulation layer 236 arranged in the trench structure 227, for example.

At least part of a first sidewall of the trench structure 227 may be arranged adjacently to a drift region 237 of a first conductivity type (e.g. n-type doped) of the MGD diode structure 104 and/or a body region 238 of a second conductivity type (e.g. p-type doped) of the MGD diode structure 104. The body region 238 of the MGD diode structure 104 may be located between a source region 239 of the MGD diode structure 104 and the drift region 237 of the MGD diode structure, for example.

The first source contact structure 232 may be electrically connected to the source region of the MGD structure 104 and to the gate (e.g. the gate electrode 235) of the MGD structure 104, for example. The MGD structure 104 may include the gate electrode 235 located in the trench structure 227, and connected at source potential. The gate electrode 235 may be separated from the body region 238 of the MGD structure 104 by the gate insulation layer 236 (e.g. a dielectric material). The n-channel of the MGD structure 104 may have a smaller threshold voltage than the threshold voltage of the MOSFET, for example.

The semiconductor device 510 may include the shielding doping region 226 arranged adjacently to the at least one sidewall (e.g. a second sidewall opposite to the first sidewall) and/or bottom of the trench structure 227, for example. The p-shielding doping region 226 may protect the gate insulation layer 236 (e.g. gate dielectric) against higher electric fields.

Optionally, a doping concentration of the shielding doping region 226 may be varied laterally. For example, a doping concentration of the shielding doping region 226 may be varied laterally, such that the shielding doping region 226 may have a lower doping concentration (e.g. between $1\times10^{16}$ dopant atoms per $cm^3$ and $1\times10^{17}$ dopant atoms per $cm^3$) towards the channel or body region of the MGD structure 104, and a higher doping concentration (e.g. at least $1\times10^{18}$ dopant atoms per $cm^3$) towards a neighboring FET structure and/or adjacent to the region of lower doping concentration. Due to the lateral variations in the doping in the p-type doped shielding doping region 226, a smaller threshold voltage and a shielding doping may be possible which may shield the electric field in the blocking state and prevent penetration of the depletion zone to the n source region, for example. The shielding doping may be lowered to pin the breakdown location (e.g. spaced from the channel) and may thus improve the avalanche strength of the MOSFET:

More details and aspects are mentioned in connection with the embodiments described above or below. The embodiments shown in FIG. 5A may comprise one or more optional additional features corresponding to one or more aspects mentioned in connection with the proposed concept or one or more embodiments described above (e.g. FIGS. 1A to 4) or below (FIGS. 5B to 10).

Figure 5B:
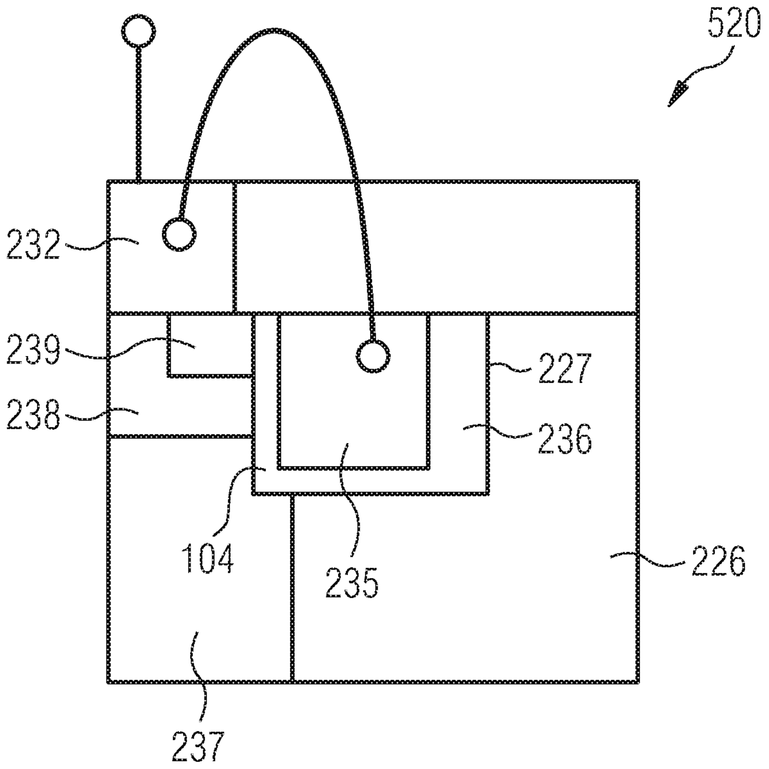
FIG. 5B shows a schematic illustration of a further semiconductor device having a metal-insulation-semiconductor gated diode structure.

FIG. 5B shows a schematic illustration of a semiconductor device 520 according to an embodiment.

The semiconductor device 520 may be similar to the semiconductor device described in connection with FIG. 5A. For example, the semiconductor device 520 may include the MGD diode structure 104 described in connection with FIG. 5A. The semiconductor device 520 may be a super junction device, for example.

Additionally or optionally, a thickness of the gate insulation layer 236 arranged on (or at) the second sidewall of the trench structure 227 may be larger than a thickness of the gate insulation layer 236 arranged on (or at) the first sidewall of the trench structure 227. For example, a thickness of the gate insulation layer 236 between the gate electrode 235 and the shielding doping region 226 at the second sidewall of the trench structure 227 may be larger than a thickness of the gate insulation layer 236 arranged on (or at) the first sidewall of the trench structure 227. The thicker gate insulation layer 236 (oxide) may allow for higher blocking voltage, for example.

The shielding doping region 226 may be part of (or may be connected to) a vertical pillar structure (e.g. a compensation region) having the same conductivity type as the shielding doping region 226, for example.

More details and aspects are mentioned in connection with the embodiments described above or below. The embodiments shown in FIG. 5B may comprise one or more optional additional features corresponding to one or more aspects mentioned in connection with the proposed concept or one or more embodiments described above (e.g. FIGS. 1A to 5A) or below (FIGS. 6 to 10).

Figure 6:
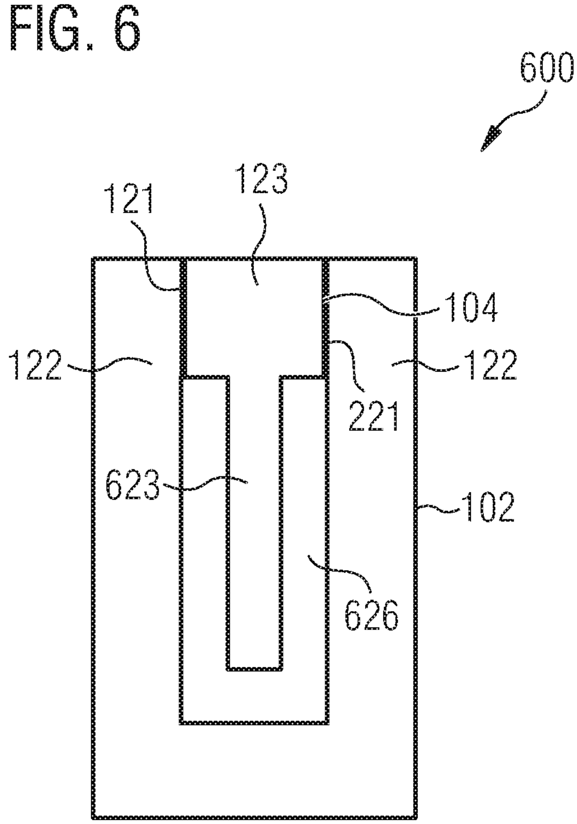
FIG. 6 shows a schematic illustration of a semiconductor device having an electrode structure.

FIG. 6 shows a schematic illustration of a portion of a semiconductor device 600 according to an embodiment.

The semiconductor device 600 may include an electrode structure extending vertically from the first lateral surface of the semiconductor substrate 102 vertically into the semiconductor substrate 102. The electrode structure may have a vertical dimension (or extension), for example. For example, the electrode structure may extend from a first lateral surface of the semiconductor substrate 102 into a depth of more than 5 μm (or more than 10 μm or more than 20 μm) into the semiconductor substrate 102.

The electrode structure may have a first portion 623 and a second portion 123. The first portion 623 of the electrode structure may have a smaller lateral dimension than the second portion 123 of the electrode structure. The second portion 123 of the electrode structure may be arranged vertically between the first lateral surface of the semiconductor substrate 102 and the first portion 623 of the electrode structure. The second portion 123 of the electrode structure may form (or may be) a Schottky contact of a Schottky diode structure 104, forming a Schottky contact interface 121 between the Schottky contact 123 and at least one drift region 122 of the SD structure 104. For example, the second portion 123 of the electrode structure may be laterally surrounded by the (n-type doped) drift region 122 of the SD structure 104.

The first portion 623 of the electrode structure may extend from a bottom of the second portion 123 vertically into the semiconductor substrate 102. The first portion 623 of the electrode structure may be laterally surrounded by a p-type doped region 626, for example. The p-type doped region 626 may be arranged laterally between the first portion 623 of the electrode structure and the (n-type doped) drift zone, for example.

The second portion 123 of the electrode structure (over the p-type doped region) may form at least one Schottk contact at the one or more sidewalls of the trench structure 227 by being connected at source potential. The first portion 623 of the electrode structure may form an ohmic source contact, and may lie buried in a trench which may be line or filled with metal in (or laterally surrounded by) the p-type doped region 626. Optionally, the trench in which the first portion 623 of the electrode structure is formed need not have sharped edges. For example, the edges of the trench may be rounded with an etching process (e.g. an adjusted dry etching process and/or a temperature process in a hydrogen ($H_2$) atmosphere with low pressure flow).

Since the ohmic contact (e.g. the first portion 623 of the electrode structure) is not merely flat along the trench bottom, but extends into the trench in (or laterally surrounded by) the p-type doped region 626, further improvement in dynamic operation may be achieved. If the trench is filled with highly conductive material the ohmic path resistance in the p-SiC column may be reduced. The highly conductive material may be a metal (e.g. aluminum, copper, tungsten or molybdenum), highly doped poly Si, or a metal silicide (tungsten-titanium). Thus the serial resistance of a p-n diode (between the p-shielding doping region and the FET drift region) may be reduced. The high current behavior of the body diode structure 104 may be improved and the problem of poor hole mobility in SiC may be solved. The deep reaching contact of the p columns may improve the avalanche strength of the FET transistor structure, as the outflowing hole current may flow laterally into the metal, flowing vertically in a low-ohmic region and therefore not influence the electric field in the p-type doped shielding doping region.

For the manufacturing of the deep reaching p-type doped regions, several processes may be used. The p-type doping region may be formed using a local p implantation. For example, the deep vertical p-type doped regions may be formed by repeatedly alternating between growing epitaxial semiconductor layers and implantation processes. Optionally, implantation in the highest layer (or portion) may be omitted before performing a masked etching process to form a trench structure (in which the material of the electrode structure is to be deposited). This may reduce scattering of the Schottky contact.

Optionally, the high p-type doping in the trench floor may be implanted over a spacer (e.g. an oxide layer), which may hinder a scattering of doping atoms in the side walls (e.g. a lateral scattering of acceptor ions upon contact with the trench floor).

Alternatively or optionally, an electrode trench may be etched. The electrode trench may be lined with p type Epi (e.g. p-type epitaxial semiconductor) using a high p-surface doping by epitaxial growth or by plasma doping. A back etch may be carried out close to the surface (e.g. using a reactive ion etch RIE) to form a trench structure. To protect the bottom of the trench structure, the top of the electrode trench may be lined with a stopping layer (e.g. $SiO_2$, or e.g. poly-Si, or e.g. Carbon, or e.g. a photoresist), which may be removed after the RIE etch.

Alternatively, the complete sidewalls of the trench and the trench bottom may be plasma doped or by an implantation, and the upper portion of the electrode trench may be expanded with an etching, to remove the p-type doping in the upper region (followed by depositing electrode material in the expanded portion of the trench). Alternatively, the upper part of the trenches may be protected by a covering layer, so that the p doping may lie only in the lower region of the pillar, and the second back etch may be waived.

More details and aspects are mentioned in connection with the embodiments described above or below. The embodiments shown in FIG. 6 may comprise one or more optional additional features corresponding to one or more aspects mentioned in connection with the proposed concept or one or more embodiments described above (e.g. FIGS. 1A to 5B) or below (FIGS. 7 to 10).

Figure 7:
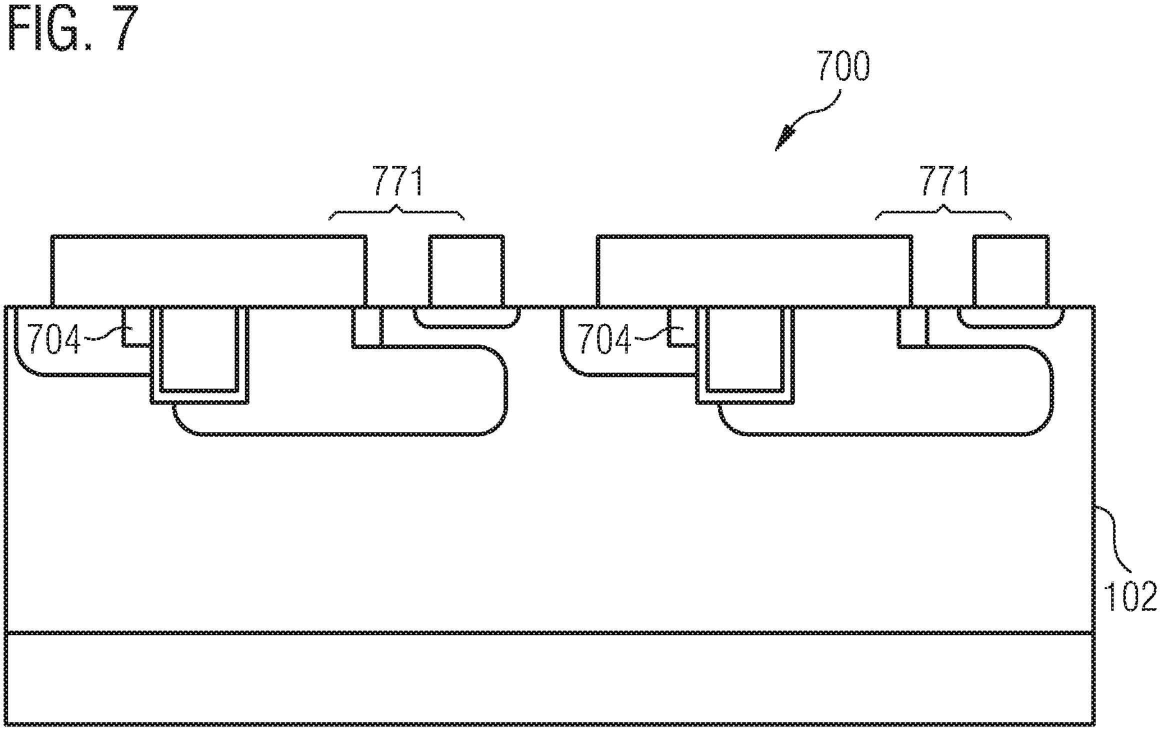
FIG. 7 shows a schematic illustration of a semiconductor device having a plurality of junction field effect transistor structures and at least one metal-insulation-semiconductor gated diode structure.

FIG. 7 shows a schematic illustration of a semiconductor device 700 according to an embodiment.

The semiconductor device 700 comprises a plurality of junction field effect transistor structures 771 of a junction field effect transistor arrangement arranged at a semiconductor substrate 102. The semiconductor device further comprises at least one metal-insulation-semiconductor gated diode structure 704.

Due to the semiconductor device 700 comprising the Schottky contact interface of a Schottky diode structure or the gate of a metal-insulation-semiconductor gated diode structure, a unipolar current path having a smaller forward voltage than a bipolar/p-n body diode between drift region and a body region may be provided. This may lead to on-state losses of the semiconductor device 700 and switching losses of the semiconductor device 700 being reduced, switching speeds being increased and/or a forward voltage drop or forward losses being improved, for example.

The plurality of junction field effect transistors structures 771 may be electrically connected in parallel with the at least one metal-insulation-semiconductor gated diode structure 704.

A channel region of a junction field effect transistor structure 771 of the plurality of junction field effect transistor structures 771 may be arranged in the semiconductor substrate 102. At least part of the channel region may extend substantially horizontally with respect to a surface of the semiconductor substrate 102, for example.

The semiconductor device 700 may further include a shielding doping region arranged between the metal-insulation-semiconductor gated diode structure 704 and a channel region of a junction field effect transistor structure 771 of the plurality of junction field effect transistor structures 771, for example.

The semiconductor device 700 may be similar to the semiconductor device described in connection with FIG. 2A, for example. However, the compensation regions described in connection with FIG. 2A may be omitted, for example.

Figure 9:
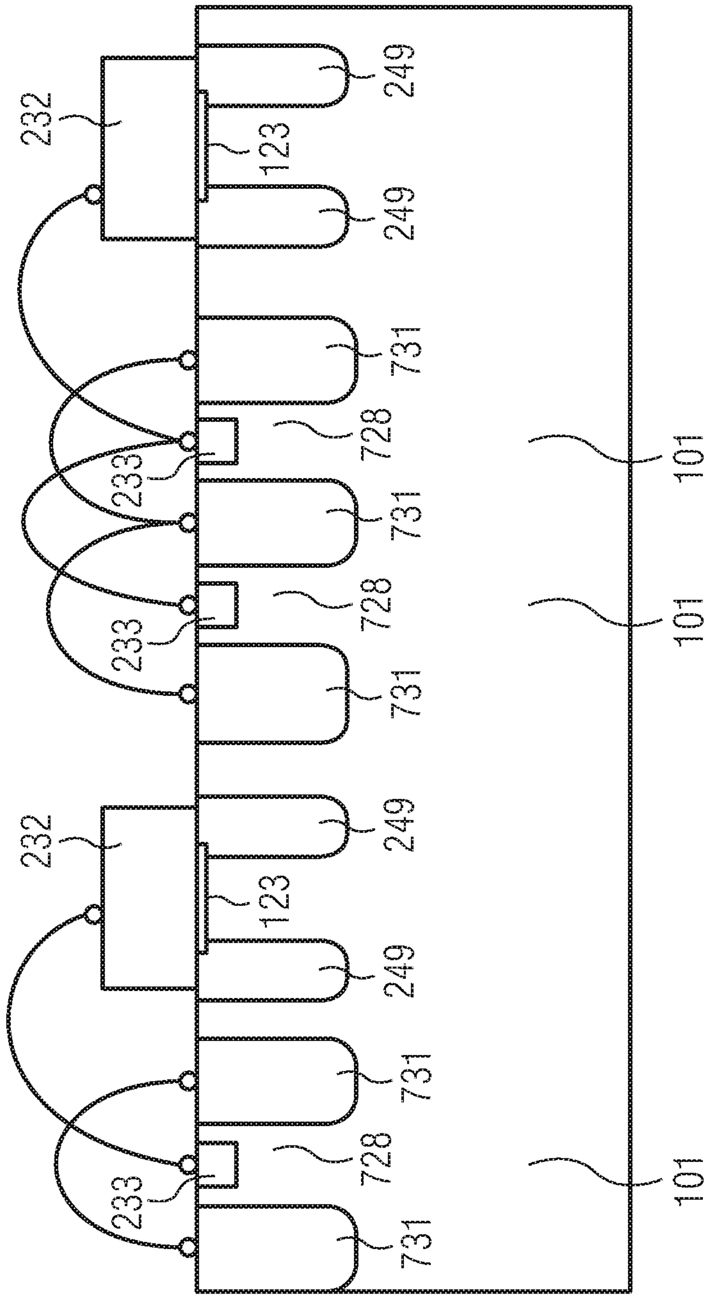
FIG. 9 shows a schematic illustration of a semiconductor device having a plurality of junction field effect transistor structures and at least one Schottky diode structure.
Figure 10:
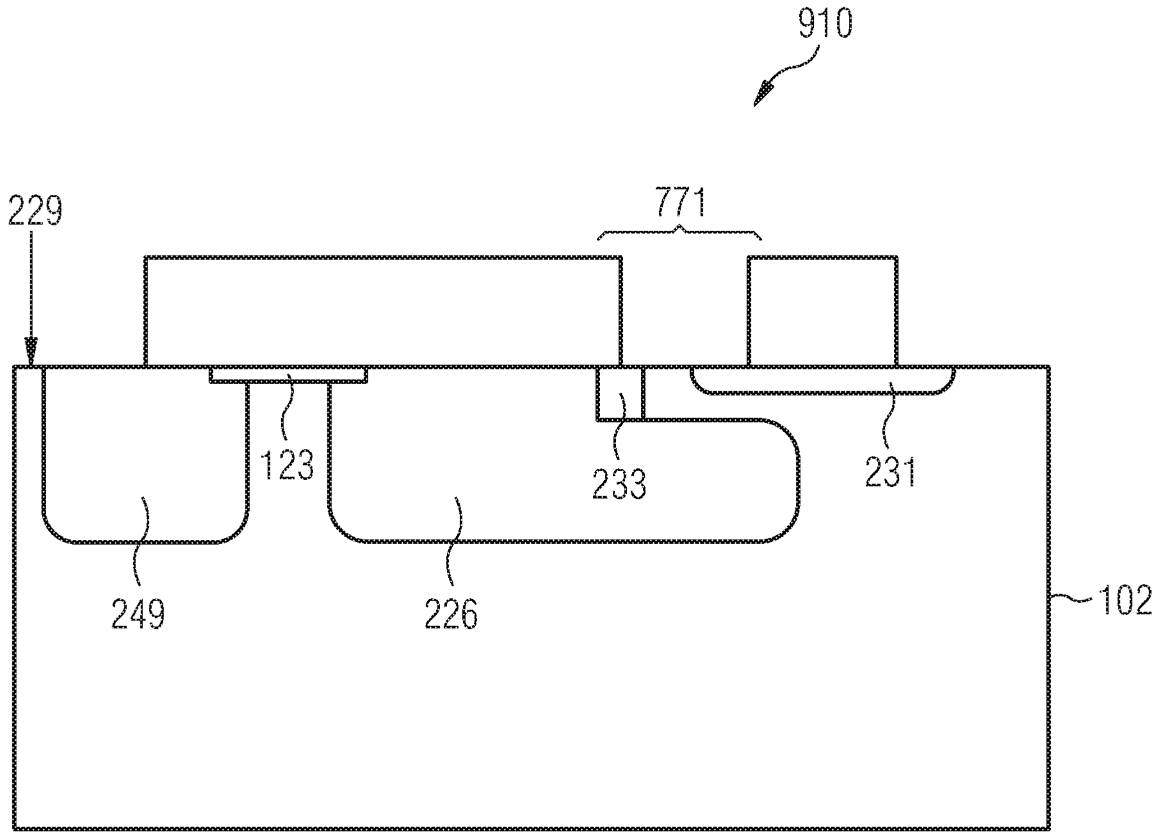
FIG. 10 shows a schematic illustration of a semiconductor device having a junction field effect transistor structure and a Schottky diode structure.

More details and aspects are mentioned in connection with the embodiments described above or below. The embodiments shown in FIG. 7 may comprise one or more optional additional features corresponding to one or more aspects mentioned in connection with the proposed concept or one or more embodiments described above (e.g. FIGS. 1A to 6) or below (FIGS. 8 to 10).

Figure 8:
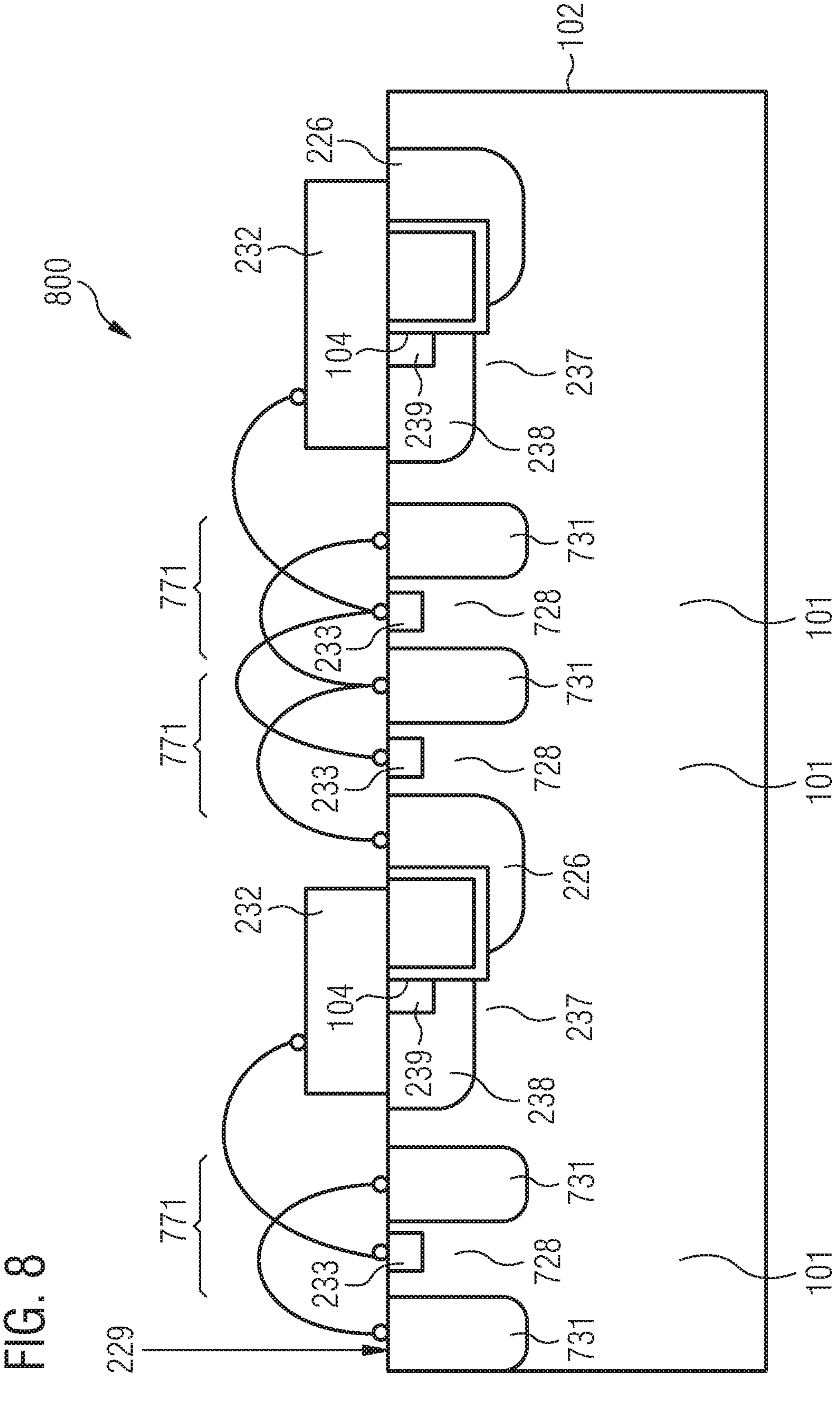
FIG. 8 shows a schematic illustration of a semiconductor device having a plurality of junction field effect transistor structures and vertical channel regions.

FIG. 8 shows a schematic illustration of a semiconductor device 800 according to an embodiment.

The semiconductor device 800 may include a plurality of JFET structures 771. Each JFET structure 771 may include a gate doping region 731 extending vertically from the first lateral surface 229 of the semiconductor substrate 102 into the semiconductor substrate 102. The gate doping region 731 may be controlled by or connected to a gate contact of the JFET structure 771 to control an electrical conductivity of a channel region 728 between the source region 233 of the JFET structure 771 located at the first lateral surface 229 of the semiconductor substrate 102 and a drain region of the JFET structure 771 located at the second (opposite) lateral surface of the semiconductor substrate 102. The channel region 728 may be arranged vertically between neighboring gate doping region 731 and/or between a gate doping region and the shielding doping region 226, for example. Charge carriers in the channel region 728 may flow vertically between the source region of the JFET structure 771 and a drift region 101 of the JFET structure. The drift region 101 of the JFET structure 771 may be located adjacently to the drain region of the JFET structure 771 at the second lateral surface of the semiconductor substrate 102, for example.

Each shielding doping region 226 may be arranged adjacently to at least one sidewall and/or bottom of a trench structure in which a Schottky contact interface of a SD structure or a gate of an MGD structure is formed. At least part of a first sidewall of the trench structure 227 may be arranged adjacently to a drift region 237 (n-type doped) of the MGD diode structure 104 and/or a body region 238 (p-type doped) of the MGD diode structure 104. The body region 238 of the MGD diode structure 104 may be located between a source region 239 of the MGD diode structure 104 and the drift region 237 of the MGD diode structure, for example.

Alternatively or optionally, the shielding doping regions 226 may be electrically connected to a transistor gate contact structure. The transistor gate contact structure may be contact (or may be electrically connected to) the transistor gates (for controlling the gate doping region 731) of the plurality of FET structures, for example.

The channel regions 728 of the JFET structures 771 may be arranged between neighboring (or consecutive) diode structures 104, for example. For example, at least one channel region 728 (e.g. more than one channel region 728) may be arranged between neighboring (or consecutive) diode structures 104, for example.

The source regions 233 of the JFET structure may be (partially or completely) shielded from the p-gates 731 of the JFET structure by the space charge zones. The MGD structure 104 allows for electrons from the drain to be removed at the terminals of the MGD structure 104, for example. The control driving may be used for low or medium load currents, for example.

More details and aspects are mentioned in connection with the embodiments described above or below. The embodiments shown in FIG. 8 may comprise one or more optional additional features corresponding to one or more aspects mentioned in connection with the proposed concept or one or more embodiments described above (e.g. FIGS. 1A to 7) or below (FIGS. 9 to 10).

FIG. 9 shows a schematic illustration of a semiconductor device 900 according to an embodiment.

The semiconductor device 900 may be similar to the semiconductor device described in connection with FIG. 8. For example, the semiconductor device 900 may include a plurality of vertically extending gate doping regions 731 and vertical channel regions 728 as described in connection with FIG. 8.

The semiconductor device 900 may include one or more Schottky contacts 123 as described in connection with FIG. 2D. A first portion of each Schottky contact 123 may overlap a first vertically extending shielding doping region 249 at the first lateral surface 229 of the semiconductor substrate 102. A second portion of the Schottky contact 123 may overlap a second vertically extending shielding doping region 249 at the first lateral surface 229 of the semiconductor substrate 102, for example.

Optionally, the Schottky contacts 123 may be located at the first lateral surface 229 of the semiconductor substrate 102. Alternatively or optionally, the Schottky contacts 123 may extend deeper into the semiconductor substrate 102 than the first vertically extending shielding doping region 249 and the second vertically extending shielding doping region 249, for example.

More details and aspects are mentioned in connection with the embodiments described above or below. The embodiments shown in FIG. 9 may comprise one or more optional additional features corresponding to one or more aspects mentioned in connection with the proposed concept or one or more embodiments described above (e.g. FIGS. 1A to 8) or below (FIG. 10).

FIG. 10 shows a schematic illustration of a semiconductor device 910 according to an embodiment.

The semiconductor device 910 may include a field effect transistor structure 771 arranged at a semiconductor substrate. The semiconductor device 910 may further include a Schottky contact 123 of a Schottky diode structure. The semiconductor device 910 may further include a shielding doping region 226 extending from a Schottky interface of the Schottky diode structure towards a channel region of the field effect transistor structure 771.

The field effect transistor structure 771 may be a JFET structure 771 as described in connection with FIG. 2A.

The semiconductor device 910 may include a laterally extending Schottky contact 123 as described in connection with FIG. 2D. A first portion of the Schottky contact 123 may overlap a vertically extending shielding doping region 249 at the first lateral surface 229 of the semiconductor substrate 102. A second portion of the Schottky contact 123 may overlap the shielding doping region 226 at the first lateral surface 229 of the semiconductor substrate 102. The shielding doping region 226 may be located between the source region 233 of the JFET structure 771 and the laterally extending Schottky contact 123 at the first lateral surface 229 of the semiconductor substrate 102.

More details and aspects are mentioned in connection with the embodiments described above or below. The embodiments shown in FIG. 10 may comprise one or more optional additional features corresponding to one or more aspects mentioned in connection with the proposed concept or one or more embodiments described above (e.g. FIGS. 1A to 9) or below.

Various examples relate to body diode functionalities for SiC circuits with low threshold voltage.

Aspects and features (e.g. the semiconductor device, the field effect transistor structure, the semiconductor substrate, the shielding doping region, the trench structure, the first sidewall of the trench structure, the bottom of the trench structure, the second sidewall of the trench structure, the drift region of the FET structure, the body region of the FET structure, the vertically extending shielding doping region, the source or emitter region of the FET structure, the drain or collector region of the FET structure, the drift region of the MGD structure, the drift region of the SD structure, the body region of the MGD structure, the source region of the MGD structure, the Schottky contact, the Schottky contact interface, the gate of the MGD structure, the channel region of the JFET structure) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:

a field effect transistor structure arranged at a semiconductor substrate, the field effect transistor structure comprising a channel region arranged in the semiconductor substrate and a transistor gate for controlling the channel region;

a trench structure extending from a surface of the semiconductor substrate into the semiconductor substrate, wherein the trench structure comprises the transistor gate;

a Schottky contact located at the surface of the semiconductor substrate and forming a Schottky contact interface with a portion of the semiconductor substrate, wherein the Schottky contact interface extends along the surface of the semiconductor substrate and is laterally spaced apart from the trench structure; and a shielding doping region laterally extending along the surface of the semiconductor substrate from a portion of at least one sidewall of the trench structure towards the channel region of the field effect transistor structure.

2. The semiconductor device of claim 1, wherein a sidewall of the trench structure vertically extends into a drift region of the field effect transistor structure.

3. The semiconductor device of claim 1, wherein the shielding doping region extends deeper into the semiconductor substrate than the trench structure.

4. The semiconductor device of claim 1, wherein at least part of the channel region of the field effect transistor structure arranged in the semiconductor substrate is substantially horizontal to the surface of the semiconductor substrate.

5. A semiconductor device, comprising:

a plurality of drift regions of a plurality of field effect transistor structures arranged in a silicon carbide substrate, wherein the plurality of drift regions comprises a first conductivity type;

a plurality of source regions of the plurality of field effect transistor structures arranged in the silicon carbide substrate, wherein the plurality of source regions comprises the first conductivity type;

a plurality of body regions of the plurality of field effect transistor structures located between the plurality of source regions and the plurality of drift regions, wherein the plurality of body regions comprises a second conductivity type opposite the first conductivity type;

a plurality of transistor gate structures of the plurality of field effect transistor structures formed in the silicon carbide substrate and extending deeper into the silicon carbide substrate from a first lateral surface of the silicon carbide body than the plurality of body regions;

a Schottky contact located at the first lateral surface of the silicon carbide substrate between adjacent transistor gate structures, each Schottky contact forming a Schottky contact interface with a portion of the silicon carbide substrate, wherein each Schottky contact interface extends along the first lateral surface of the silicon carbide substrate between the adjacent transistor gate structures, wherein each Schottky contact laterally extends into the adjacent body region and terminates before reaching the source region formed in the adjacent body region.

6. The semiconductor device of claim 5, further comprising a shielding doping region comprising the second conductivity type adjoining a sidewall of each transistor gate structure and laterally extending to the adjacent Schottky contact.

7. The semiconductor device of claim 6, wherein each shielding doping region terminates in a lateral direction before reaching the adjacent body region.

8. The semiconductor device of claim 6, wherein each shielding doping region extends under the adjoining transistor gate structure.

9. The semiconductor device of claim 6, wherein each shielding doping region extends deeper into the silicon carbide substrate than the adjoining transistor gate structure.

10. The semiconductor device of claim 5, wherein the plurality of field effect transistor structures comprises a plurality of junction field effect transistor structures, a plurality of metal oxide semiconductor field effect transistor structures, or a plurality of insulated gate bipolar transistor structures.

11. The semiconductor device of claim 5, wherein a blocking voltage of the semiconductor device is greater than 10 V.

* * * * *